United States Patent
Shiraki et al.

(10) Patent No.: US 8,804,316 B2
(45) Date of Patent: Aug. 12, 2014

(54) ELECTRONIC DEVICE PACKAGE, ELECTRONIC DEVICE, AND ELECTRONIC APPARATUS

(75) Inventors: Manabu Shiraki, Ina (JP); Tadanori Yamada, Okaya (JP); Kazumi Hara, Suwa (JP); Kazuhiko Shimodaira, Minowa (JP)

(73) Assignee: Seiko Epson Corporation (JP)

( * ) Notice: Subject to any disclaimer, the term of this patent is extended or adjusted under 35 U.S.C. 154(b) by 155 days.

(21) Appl. No.: 13/539,982

(22) Filed: Jul. 2, 2012

(65) Prior Publication Data

US 2013/0010412 A1    Jan. 10, 2013

(30) Foreign Application Priority Data

Jul. 4, 2011   (JP) ................................. 2011-148687

(51) Int. Cl.
 *H05K 7/00*   (2006.01)
 *H05K 5/00*   (2006.01)
 *H01L 23/28*  (2006.01)
 *H05K 7/14*   (2006.01)

(52) U.S. Cl.
 USPC ....... 361/679.01; 174/520; 174/521; 174/535

(58) Field of Classification Search
 USPC ..................... 174/520, 521, 535; 361/679.01
 See application file for complete search history.

(56) References Cited

U.S. PATENT DOCUMENTS

| | | | |
|---|---|---|---|
| 5,786,548 A * | 7/1998 | Fanucchi et al. | 174/50.54 |
| 2004/0094320 A1 | 5/2004 | Goto et al. | |
| 2005/0184625 A1* | 8/2005 | Miyazaki | 310/348 |
| 2006/0022319 A1* | 2/2006 | Matsuzawa et al. | 257/678 |
| 2009/0174291 A1* | 7/2009 | Nagano et al. | 310/344 |
| 2009/0218917 A1* | 9/2009 | Tanaya | 310/370 |

FOREIGN PATENT DOCUMENTS

| | | |
|---|---|---|
| CN | 1476083 A | 2/2004 |
| JP | 2004-254238 | 9/2004 |
| JP | 2004-289238 | 10/2004 |
| JP | 3972360 | 6/2007 |
| JP | 3982263 | 7/2007 |
| JP | 4341268 | 7/2009 |
| JP | 2013-016659 | 1/2013 |

* cited by examiner

*Primary Examiner* — Jeremy C Norris
*Assistant Examiner* — Sherman Ng
(74) *Attorney, Agent, or Firm* — Harness, Dickey & Pierce, P.L.C.

(57) ABSTRACT

A package includes a base member and a lid member joined to the base member while forming, between the lid and base members, an internal space which stores an electronic component. A joined section of the base and lid members includes a first welded section formed by joining the base and lid members along an x axis direction using seam welding and a second welded section formed by joining the base and lid members along a y axis direction using the seam welding. In plan view, the first and second welded sections do not overlap each other. An area where an area formed by extending the first welded section in the x axis direction and an area formed by extending the second welded section in the y axis direction overlap each other is located on the outer side with respect to the contour of the lid member.

20 Claims, 20 Drawing Sheets

ELECTRONIC DEVICE PACKAGE, ELECTRONIC DEVICE, AND ELECTRONIC APPARATUS

BACKGROUND

1. Technical Field

The present invention relates to an electronic device package, an electronic device, and an electronic apparatus.

2. Related Art

As an electronic device having an electronic component housed in a package, for example, a piezoelectric device disclosed in JP-A-2004-289238 is known.

The piezoelectric device disclosed in JP-A-2004-289238 includes a piezoelectric vibrating reed, which is an electronic component, and a package that houses the piezoelectric vibrating reed. The package of the piezoelectric device includes a package main body including a concave section and a lid body that covers an opening of the concave section of the package main body.

In the past, as disclosed in JP-A-2004-289238, such a package is formed by forming a through-hole in the package main body in advance and, after joining the package main body and the lid body, closing the through-hole with a sealing material, which is formed of metal such as an Au—Ge alloy, under reduced pressure. Consequently, it is possible to remove, from the inside of the package, unnecessary gas generated during the joining of the package main body and the lid body and obtain a hermetically sealed package.

However, in such a package, since the sealing material is used, material expenses increase. As a result, an increase in costs is caused.

SUMMARY

An advantage of some aspects of the invention is to provide an electronic device package and an electronic device that can realize a reduction in costs and realize high-quality hermetical sealing and to provide a highly-reliable electronic apparatus including such an electronic device.

APPLICATION EXAMPLE 1

This application example of the invention is directed to an electronic device package including: a base member; and a lid member having, in plan view, a pair of first sides, which extend along a first direction, and a pair of second sides, which extend along a second direction crossing the first direction, and arranged on the base member while forming, between the lid member and the base member, an internal space in which an electronic component is housed. A joined section of the base member and the lid member includes a first welded section formed by joining the base member and the lid member along the first sides using seam welding and a second welded section formed by joining the base member and the lid member along the second sides using the seam welding. In plan view, the first welded section and the second welded section do not overlap each other, and an area where an area formed by extending the first welded section in the first direction and an area formed by extending the second welded section in the second direction overlap each other is located on the outer side with respect to the contour of the lid member.

With the electronic device package configured in this way, it is possible to locally form a gap between the base member and the lid member after the seam welding. Therefore, by closing the gap through welding under reduced pressure or under an inert gas atmosphere, it is possible to remove gas generated during the seam welding from the inside of the package and realize high-quality hermetical sealing.

Since the through-hole and the sealing material in the past are unnecessary, it is possible to realize a reduction in costs.

APPLICATION EXAMPLE 2

In the electronic device package, it is preferred that the joined section of the base member and the lid member includes a third welded section formed by locally joining the base member and the lid member using energy beam welding to correspond to respective corners of the contour of the lid member in plan view.

Consequently, it is possible to easily and surely close, under reduced pressure or under an inert gas atmosphere, a gap locally formed between the base member and the lid member after the seam welding.

APPLICATION EXAMPLE 3

In the electronic device package, it is preferred that R-chamfering is applied to the respective corners of the contour of the lid member in plan view. When the width of each of the first welded section and the second welded section is represented as W and a curvature radius of the R-chamfering is represented as R, a relation $W<(1-1/\sqrt{2})R$ is satisfied.

Consequently, it is possible to locally form a gap between the base member and the lid member after the seam welding.

APPLICATION EXAMPLE 4

In the electronic device package, it is preferred that the lid member includes a concave section for housing the electronic component. A flange is formed in the outer periphery of an opening of the concave section. When the width of the flange is represented as m, a relation $m<(1-1/\sqrt{2})R$ is satisfied.

Consequently, it is possible to easily and surely locally form a gap between the base member and the lid member after the seam welding.

APPLICATION EXAMPLE 5

In the electronic device package, it is preferred that C-chamfering is applied to the respective corners of the contour of the lid member in plan view. When the width of each of the first welded section and the second welded section is represented as W and a chamfering dimension of the C-chamfering is represented as C, a relation $W<C/2$ is satisfied.

Consequently, it is possible to locally form a gap between the base member and the lid member after the seam welding.

APPLICATION EXAMPLE 6

In the electronic device package, it is preferred that the lid member includes a concave section for housing the electronic component. A flange is formed in the outer periphery of an opening of the concave section. When the width of the flange is represented as m, a relation $m<C/2$ is satisfied.

Consequently, it is possible to easily and surely locally form a gap between the base member and the lid member after the seam welding.

APPLICATION EXAMPLE 7

In the electronic device package, it is preferred that the lid member is joined to the base member via a joining member formed of a metal material. The contour of the lid member is formed to overlap the joining member in plan view.

Consequently, it is possible to join the base member and the lid member and hermetically seal the inside of the package without depending on a member that forms the base member.

APPLICATION EXAMPLE 8

This application example of the invention is directed to an electronic device including: the electronic device package explained above; and an electronic component housed in the electronic device package.

With such an electronic device, it is possible to realize a reduction in costs and realize high-quality hermetical sealing.

APPLICATION EXAMPLE 9

This application example of the invention is directed to an electronic apparatus including the electronic device explained above.

With such an electronic apparatus, it is possible to realize a reduction in costs and improve reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of the invention are explained in detail below with reference to the accompanying drawings. In an example explained below, an electronic device is applied to a sensor device.

First Embodiment

First, a first embodiment of the invention is explained.

Figure 1:
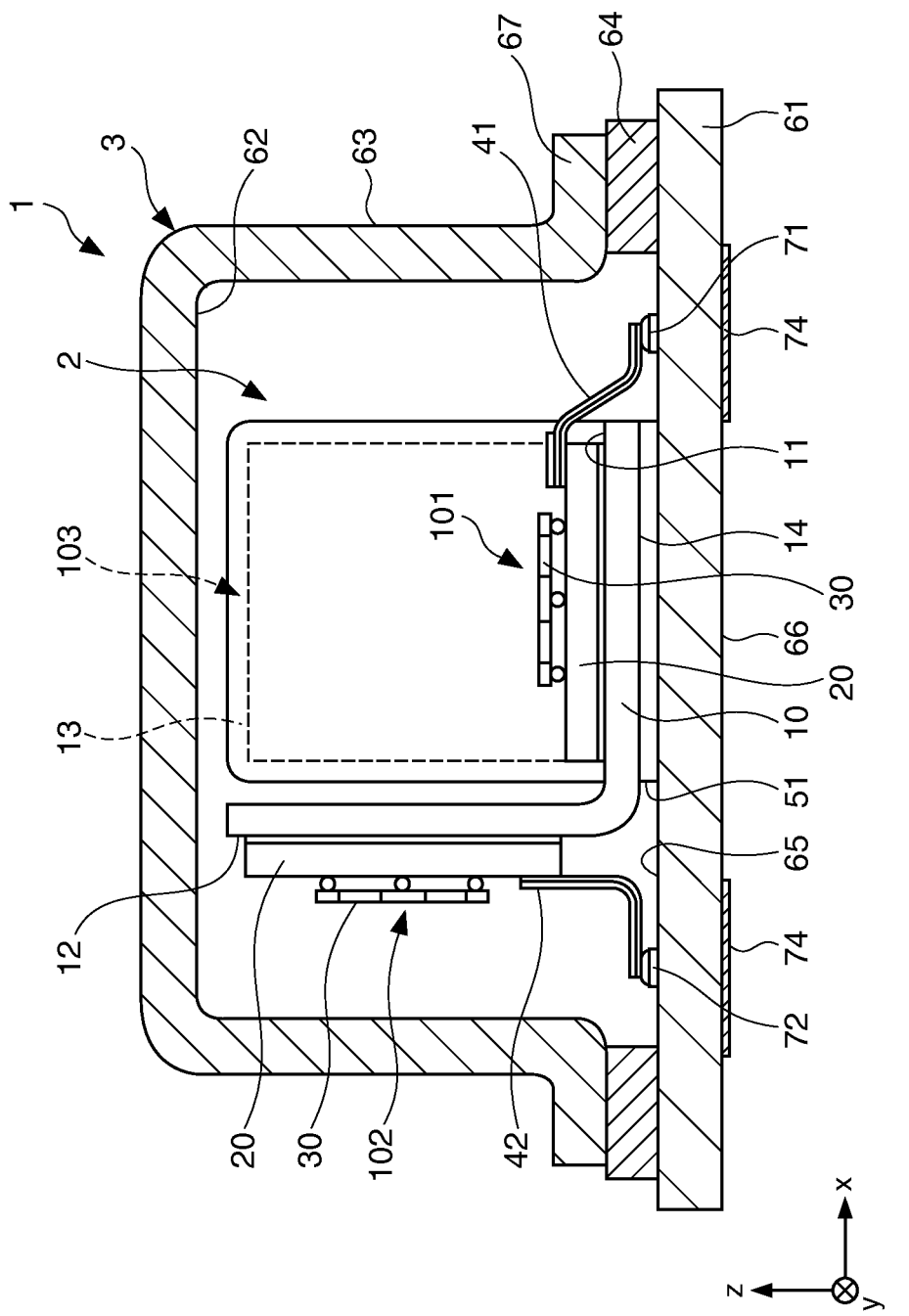
FIG. 1 is a schematic sectional view showing a schematic configuration of a sensor device (an electronic device) according to a first embodiment of the invention.
Figure 2:
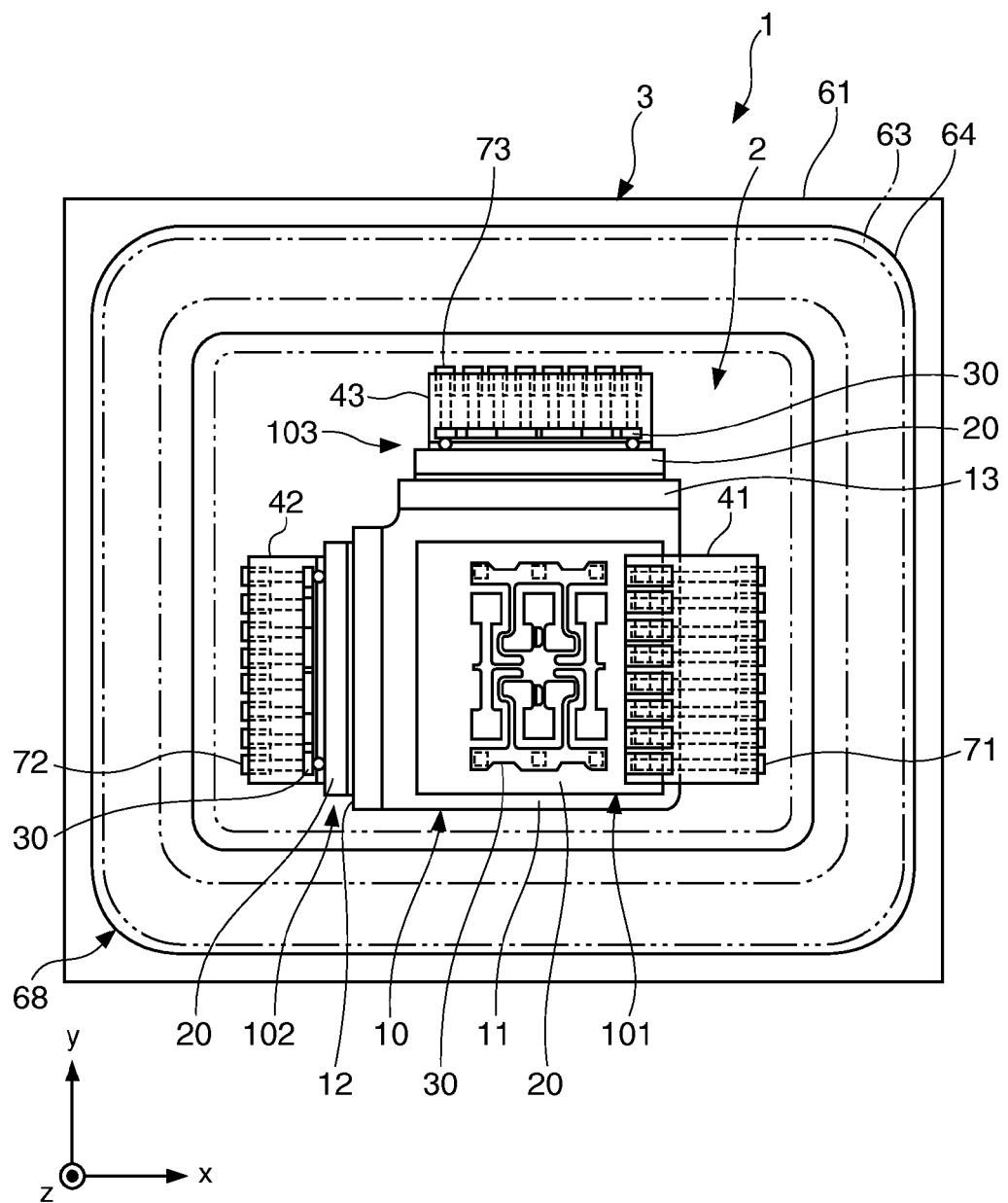
FIG. 2 is a plan view of the sensor device shown in FIG. 1.
Figure 3:
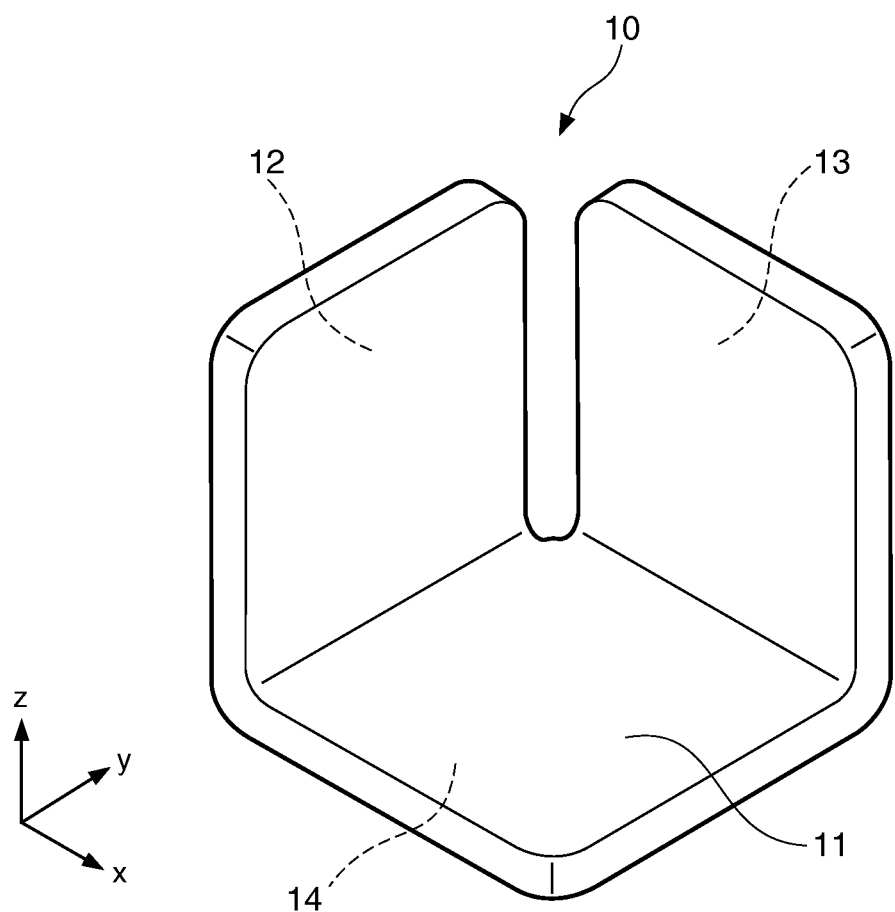
FIG. 3 is a perspective view showing a supporting member included in a sensor module (an electronic component module) of the sensor device shown in FIG. 1.
Figure 4:
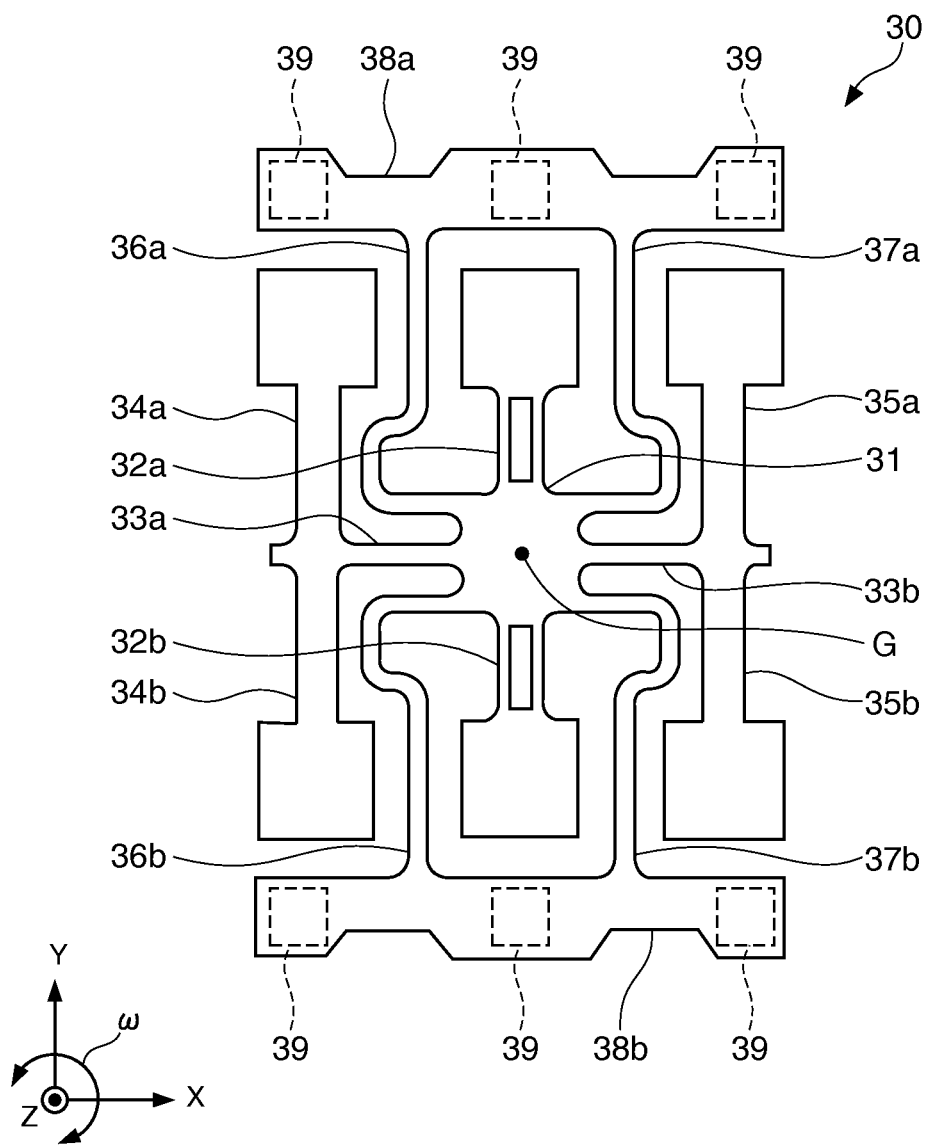
FIG. 4 is a plan view of a sensor element (an electronic component) included in the sensor module of the sensor device shown in FIG. 1.
Figure 5:
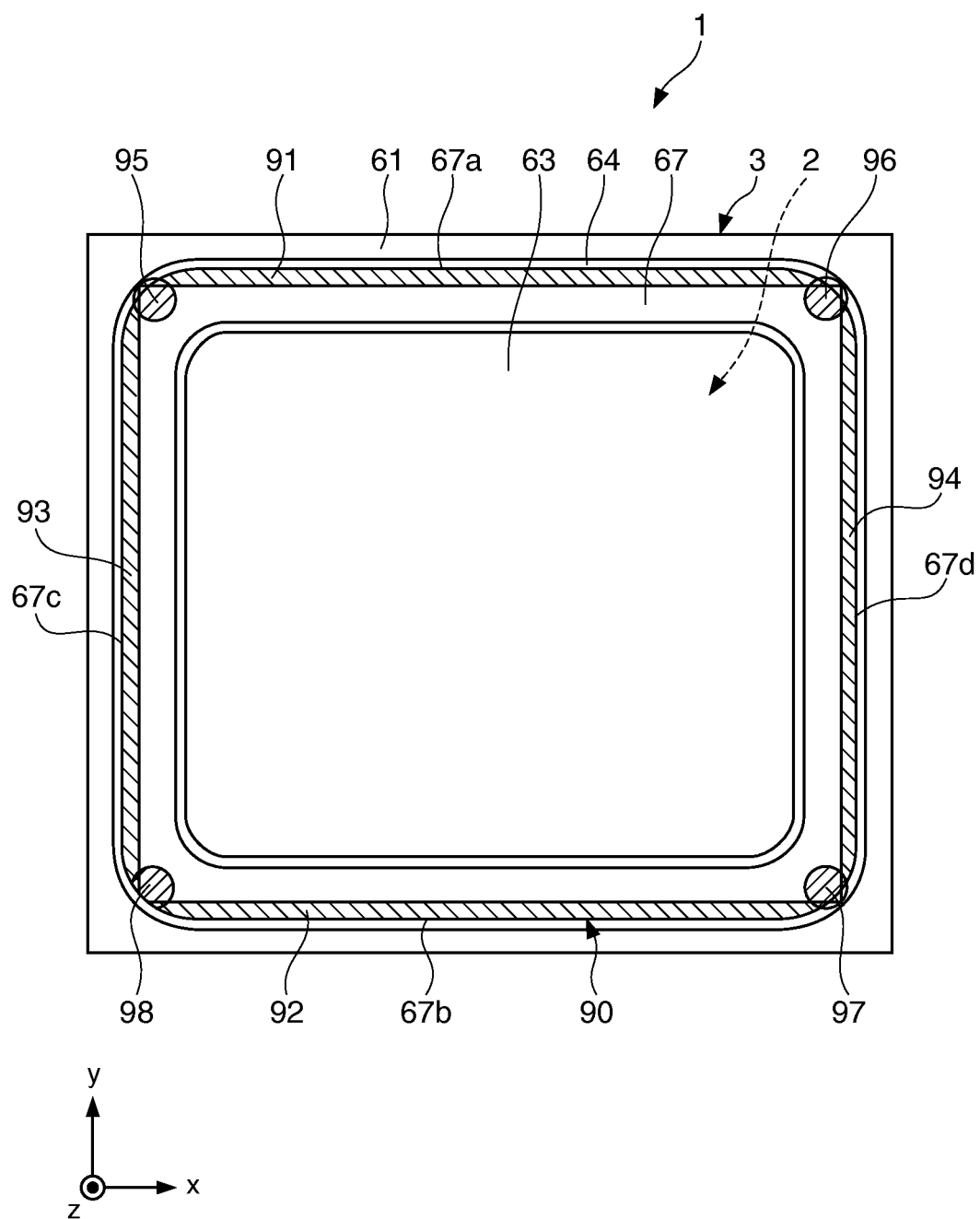
FIG. 5 is a plan view of a package of the sensor device shown in FIG. 1.
Figure 6:
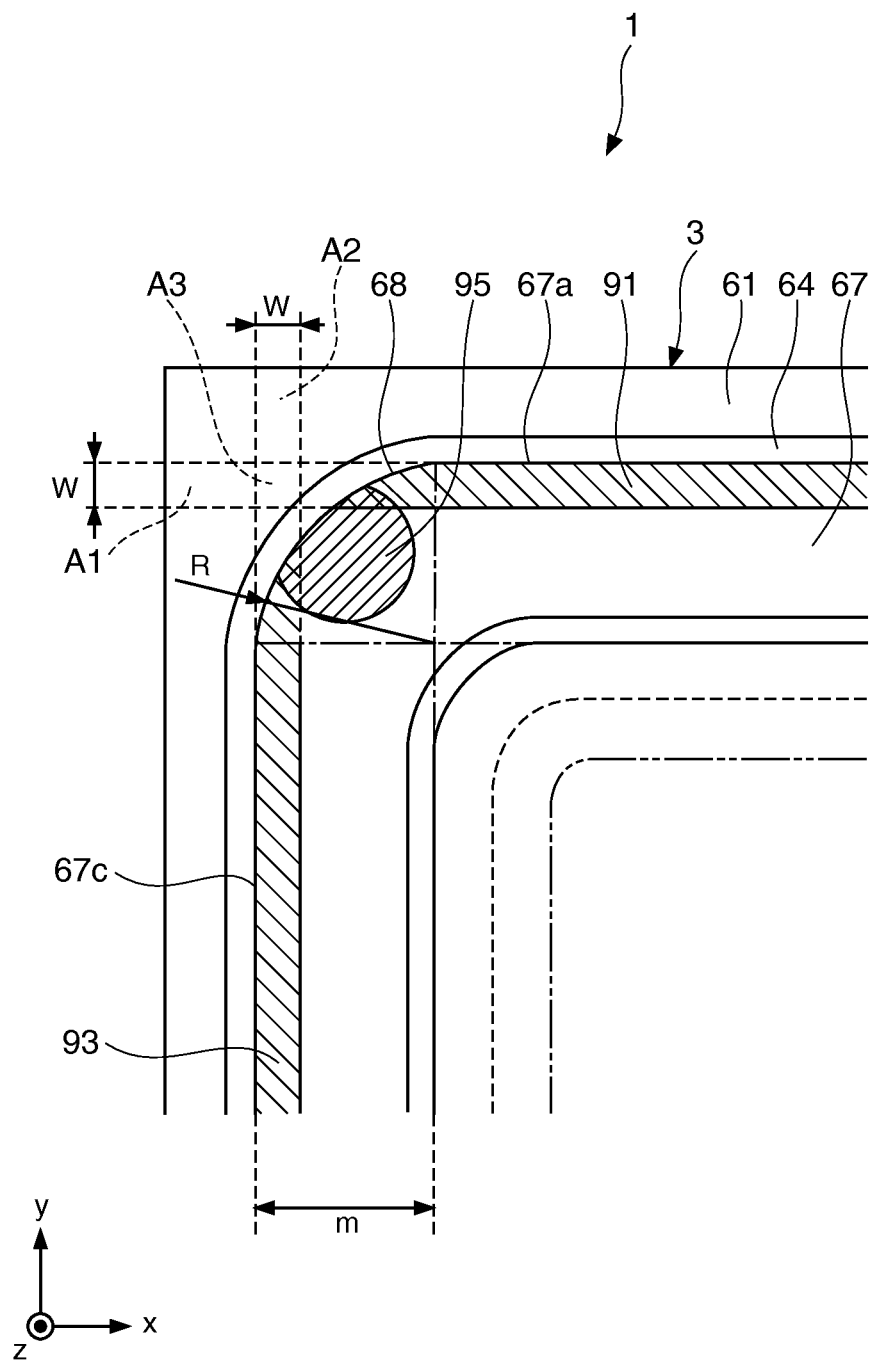
FIG. 6 is a partially enlarged plan view of the package shown in FIG. 5.

FIG. 1 is a schematic sectional view showing a schematic configuration of a sensor device (an electronic device) according to the first embodiment of the invention. FIG. 2 is a plan view of the sensor device shown in FIG. 1. FIG. 3 is a perspective view showing a supporting member included in a sensor module (an electronic component module) of the sensor device shown in FIG. 1. FIG. 4 is a plan view of a sensor element (an electronic component) included in the sensor module of the sensor device shown in FIG. 1. FIG. 5 is a plan view of a package of the sensor device shown in FIG. 1. FIG. 6 is a partially enlarged plan view of the package shown in FIG. 5.

In the following explanation, for convenience of explanation, the upper side and the lower side in FIG. 1 are respectively referred to as "upper" and "lower". For convenience of explanation, in FIGS. 1 to 3, 5, and 6, an x axis, a y axis, and a z axis are shown as three axes orthogonal to one another. A direction parallel to the x axis is referred to as "x axis direction", a direction parallel to the y axis is referred to as "y axis direction", and a direction parallel to the z axis (the up down direction) is referred to as "z axis direction".

Electronic Device

A sensor device (an electronic device) 1 shown in FIG. 1 is a gyro sensor that detects angular velocity around each of the three axes of the x axis, the y axis, and the z axis orthogonal to one another.

Such a sensor device 1 can be used for, for example, hand shake correction for an imaging apparatus and posture detection and posture control for a vehicle or the like in a mobile navigation system using a GPS (Global Positioning System) satellite signal.

The sensor device 1 includes, as shown in FIG. 1, a sensor module 2 and a package 3 that houses the sensor module 2.

Sections included in the sensor device 1 are sequentially explained below.

Sensor Module 2

As shown in FIGS. 1 and 2, the sensor module 2 includes a supporting member 10, a sensor unit 101 that detects angular velocity around the z axis, a sensor unit 102 that detects angular velocity around the x axis, and a sensor unit 103 that detects angular velocity around the y axis. The sensor units 101, 102, and 103 respectively include IC chips 20 and sensor elements 30 (sensor element pieces). The sensor unit 101 includes a flexible wiring board 41. The sensor unit 102 includes a flexible wiring board 42. The sensor unit 103 includes a flexible wiring board 43.

As explained above, the sensor module 2 includes the supporting member 10, the three IC chips 20, the three sensor elements 30, and the three flexible wiring boards 41, 42, and 43.

Supporting Member 10

The supporting member 10 has a function of supporting the three sensor units 101, 102, and 103.

The supporting member 10 includes, as shown in FIG. 3, a first supporting surface 11 orthogonal to the z axis, a second supporting surface 12 orthogonal to the x axis, and a third supporting surface 13 orthogonal to the y axis.

Each of an angle θ1 formed by the first supporting surface 11 and the second supporting surface 12, an angle θ2 formed by the second supporting surface 12 and the third supporting surface 13, and an angle θ3 forming the first supporting surface 11 and the third supporting surface 13 is 90 degrees (a right angle). Each of the angles θ1 to θ3 does not have to be strictly 90 degrees. A slight error (about 0 degree to 2 degrees) is allowed in a range in which the error does not affect the sensing function of the sensor module 2.

A material forming such a supporting member 10 is not specifically limited. For example, metal such as structural steel, stainless steel, copper, brass, phosphor bronze, or nickel silver can be suitably used.

When the supporting member 10 is formed of the metal explained above, a metal plate formed of such metal can be bent. The shape of the supporting member 10 is not limited to the shape shown in FIG. 3. The supporting member 10 may be formed of a block body having, for example, a rectangular parallelepiped shape, a polygon pillar shape, a polygon pyramid shape.

IC Chip 20

The IC chip 20 shown in FIGS. 1 and 2 has a function of driving the sensor element 30 and a function of detecting a signal from the sensor element 30.

The IC chip 20 is formed in a tabular shape. One surface of the IC chip 20 forms an active surface and the other surface forms an inactive surface.

The inactive surface of the IC chip 20 of the sensor unit 101 is bonded to the first supporting surface 11 of the supporting member 10 by an adhesive (not shown) having insulating properties. The inactive surface of the IC chip 20 of the sensor unit 102 is bonded to the second supporting surface 12 of the supporting member 10 by the adhesive (not shown) having insulating properties. The inactive surface of the IC chip 20 of the sensor unit 103 is bonded to the third supporting surface 13 of the supporting member 10 by the adhesive (not shown) having insulating properties.

On the other hand, on the active surface of the IC chip 20, although not shown in the figures, an integrated circuit including a driving circuit that drives the sensor element 30 and a detection circuit that detects a signal from the sensor element 30 is formed.

On the active surface side of the IC chip 20, although not shown in the figures, a connection terminal and an external connection terminal electrically connected to the integrated circuit are provided.

The connection terminal of the IC chip 20 is a protruding electrode formed in a bump shape using, for example, a solder ball, a gold wire, or an aluminum wire. Such a connection terminal is electrically and mechanically connected to the sensor element 30. Consequently, the integrated circuit of the IC chip 20 is electrically connected to the sensor element 30.

The connection terminal also has a function of fixing the sensor element 30 to the IC chip 20 and supporting the sensor element 30. Since the connection terminal is the protruding electrode, the connection terminal also functions as a spacer that forms a gap between the sensor element 30 and the IC chip 20. Consequently, it is possible to secure a space for allowing driving vibration and detection vibration of the sensor element 30.

The external connection terminal of the IC chip 20 is a protruding electrode formed in a bump shape using, for example, a solder ball, a gold wire, or an aluminum wire. Such an external connection terminal is electrically connected to the flexible wiring board 41 in the sensor unit 101, electrically connected to the flexible wiring board 42 in the sensor unit 102, and electrically connected to the flexible wiring board 43 in the sensor unit 103. Consequently, the integrated circuits of the IC chips 20 of the sensor units 101, 102, and 103 are respectively electrically connected to the flexible wiring boards 41, 42, and 43.

Sensor Element 30

The sensor element 30 is a gyro sensor element that detects angular velocity around one axis.

A main part (a substrate) of the sensor element 30 is formed of quartz, which is a piezoelectric material.

The quartz has an X axis (an electrical axis), a Y axis (a mechanical axis), and a Z axis (an optical axis) orthogonal to one another. The sensor element 30 is formed in a plate shape having plate surfaces parallel to the X axis and the Y axis of the quartz. The Z axis of the quartz is present along the thickness direction of the sensor element 30. The thickness of such a sensor element 30 is set as appropriate according to an oscillation frequency (a resonant frequency), an external size, workability, and the like.

Concerning each of the directions of the X axis, the Y axis, and the Z axis of the quartz in the sensor element 30, an error during slicing from the quartz can be allowed in a small range (0 degree to 7 degrees).

The sensor element 30 is formed by etching (wet etching or dry etching) employing a photolithography technique.

As shown in FIG. 4, the sensor element 30 has a structure called double T type.

The sensor element 30 includes a base section 31, a pair of vibrating arms for detection 32a and 32b extending from the base section 31 along the Y axis, a pair of coupling arms 33a and 33b extending from the base section 31 along the X axis, a pair of vibrating arms for driving 34a and 34b extending from the distal end of the coupling arm 33a along the Y axis, and a pair of vibrating arms for driving 35a and 35b extending from the distal end of the coupling section 33b along the Y axis.

The sensor element 30 includes a supporting section 38a extending along the X axis on the opposite side of the base section 31 and the pair of coupling arms 33a and 33b with respect to the vibrating arm for detection 32a and the vibrating arms for driving 34a and 35a, a supporting section 38b extending along the X axis on the opposite side of the base section 31 and the pair of coupling arms 33a and 33b with respect to the vibrating arm for detection 32b and the vibrating arms for driving 34b and 35b, a pair of supporting arms 36a and 36b that connect the supporting section 38a and the base section 31, and a pair of supporting arms 37a and 37b that connect the supporting section 38b and the base section 31.

Further, the sensor element 30 includes detection electrodes (not shown in the figure) respectively provided on the vibrating arms for detection 32a and 32b, driving electrodes (not shown in the figure) respectively provided on the vibrating arms for driving 34a, 34b, 35a, and 35b, and plural connection electrodes 39 provided on one surfaces of the supporting sections 38a and 38b and electrically connected to the detection electrodes and the driving electrodes.

Such a sensor element 30 is mounted on the active surface of the IC chip 20 to overlap the IC chip 20 in plan view of the sensor element 30.

The connection electrodes 39 are electrically and mechanically connected to connection terminals of the IC chip 20, whereby the sensor element 30 is mounted on the IC chip 20.

The sensor element 30 is set such that a plate surface of the sensor element 30 extends along (substantially parallel to) a plate surface of the IC chip 20. Consequently, in the sensor unit 101, the plate surface of the sensor element 30 is orthogonal to the z axis. In the sensor unit 102, the plate surface of the sensor element 30 is orthogonal to the x axis. In the sensor unit 103, the plate surface of the sensor element 30 is orthogonal to the y axis.

In the sensor element 30 configured as explained above, a driving signal is applied to the connection electrodes (driving electrodes) from the integrated circuit (the driving circuit) of the IC chip 20, whereby the vibrating arm for driving 34a and the vibrating arm for driving 35a perform bending vibration (driving vibration) to come close to and separate from each other and the vibrating arm for driving 34b and the vibrating arm for driving 35b perform bending vibration (driving vibration) to come close to and separate from each other in a direction same as the direction of the bending vibration of the vibrating arm for driving 34a and the vibrating arm for driving 35a.

In a state in which the vibrating arms for driving 34a, 34b, 35a, and 35b are caused to perform the driving vibration, when angular velocity ω around the normal, which passes the center of gravity G of the sensor element 30, is applied to the sensor element 30, Coriolis force acts on the vibrating arms for driving 34a, 34b, 35a, and 35b. Consequently, the base section 31 is caused to perform pivoting vibration around the normal (a detection axis), which passes the center of gravity G, while the coupling arms 33a and 33b are caused to perform bending vibration. According to the pivoting vibration, bending vibration (detection vibration) of the vibrating arms for detection 32a and 32b is excited.

It is possible to calculate the angular velocity ω applied to the sensor element 30 by detecting charges generated in the detection electrodes by the detection vibration of the vibrating arms for detection 32a and 32b.

Specifically, the sensor element 30 of the sensor unit 101 can detect the angular velocity around the z axis because the plate surface of the sensor element 30 is orthogonal to the z axis. The sensor element 30 of the sensor unit 102 can detect the angular velocity around the x axis because the plate surface of the sensor element 30 is orthogonal to the x axis. The sensor element 30 of the sensor unit 103 can detect the angular velocity around the y axis because the plate surface of the sensor element 30 is orthogonal to the y axis.

Flexible Wiring Boards 41, 42, and 43

The flexible wiring boards 41, 42, and 43 shown in FIGS. 1 and 2 respectively include base layers (not shown in the figures) mainly formed of resin having flexibility such as polyimide and wiring pattern layers (not shown) joined to the base layers.

One end of the wiring pattern layer of the flexible wiring board 41 is attached (joined) to the external connection terminal (not shown in the figures) of the IC chip 20 supported by the first supporting surface 11. The other end of the wiring pattern layer is electrically connected to an internal terminal 71 of the package 3 explained below. Similarly, one end of the wiring pattern layer of the flexible wiring board 42 is attached (joined) to the external connection terminal (not shown) of the IC chip 20 supported by the second supporting surface 12. The other end of the wiring pattern layer is electrically connected to an internal terminal 72 of the package 3 explained below. One end of the wiring pattern layer of the flexible wiring board 43 is attached (joined) to the external connection terminal (not shown) of the IC chip 20 supported by the third supporting surface 13. The other end of the wiring pattern layer is electrically connected to the internal terminal 73 of the package 3 explained later.

With the sensor module 2 configured as explained above, it is possible to detect angular velocity around each of the x axis, the y axis, and the z axis.

Such a sensor module 2 is housed in the package 3. Consequently, it is possible to provide the sensor device 1 that can detect the angular velocity around each of the x axis, the y axis, and the z axis.

Compared with a sensor module obtained by combining three sensor devices that detect angular velocity around one axis (a sensor module in which three sensor devices are separately incorporated in apparatuses), a mounting space for the sensor module 2 can be considerably reduced. Therefore, it is possible to realize a reduction in the size of an apparatus in which the sensor device 1 is incorporated and improve degrees of freedom of arrangement, design, and the like in incorporating the sensor device 1 in the apparatus.

Compared with the sensor module obtained by combining three sensor devices that detect angular velocity around one axis, the sensor module 2 only has to include a small number of packages. Therefore, it is possible to realize a reduction in costs.

Compared with the sensor module obtained by combining three sensor devices that detect angular velocity around one axis, attachment posture of the sensor module 2 can be original stable posture. Therefore, it is possible to improve shock resistance.

A degree of orthogonality of the detection axes of the three sensor elements 30 of the sensor module 2 depends on machining accuracy (accuracy of the angles θ1, θ2, and θ3) of the supporting member 10. Therefore, the degree of orthogonality of the three detection axes does not depend on mounting accuracy in the apparatus in which the sensor device 1 is incorporated (accuracy of an attachment angle of the package). It is possible to easily realize an increase in detection accuracy. On the other hand, in the sensor module obtained by combining three sensor devices that detect angular velocity around one axis, since the degree of orthogonality of the three detection axes depends on mounting accuracy of the sensor devices, it is difficult to improve detection accuracy.

Package 3

As shown in FIGS. 1 to 5, the package 3 includes a flat base member 61 and a lid member 63 (a cap) including a concave section 62.

In this embodiment, the base member 61 is formed in a rectangular shape in plan view viewed from the z axis direction (hereinafter simply referred to as "plan view").

The base member 61 is formed of, for example, an aluminum oxide sintered body, quartz, or glass.

As shown in FIG. 1, a rear surface 14 on the opposite side of the first supporting surface 11 of the supporting member 10 is joined to an upper surface 65 (a surface on a side covered with the lid member 63) of the base member 61 by a joining member 51 such as an adhesive. Consequently, the sensor module 2 is supported on and fixed to the base member 61 of the sensor module 2.

The internal terminals 71, 72, and 73 are provided on the upper surface 65 of the base member 61. The flexible wiring boards 41, 42, and 43 of the sensor module 2 are electrically connected to the internal terminals 71, 72, and 73 via a joining member (not shown) having conductivity such as a conductive adhesive, an anisotropic conductive film, or solder.

On the other hand, on a lower surface 66 of the base member 61 (the bottom surface of the package 3 and a surface along the upper surface 65), plural external terminals 74 used in mounting the sensor device 1 in an apparatus (an external apparatus) in which the sensor device 1 is incorporated.

The plural external terminals 74 are electrically connected to the internal terminals 71, 72, and 73 via a not-shown internal wire. Consequently, the respective sensor units 101, 102, and 103 of the sensor module 2 and the plural external terminals 74 are electrically connected.

The internal terminals 71, 72, and 73 and the external terminals 74 are respectively formed of metal films formed by laminating, with plating or the like, a film of nickel (Ni), gold (Au), or the like on a metalize filter of tungsten (W) or the like.

On the upper surface 65 of the base member 61 to which the sensor module 2 is attached as explained above, the lid member 63 is provided to cover the sensor module 2.

The lid member 63 includes the concave section 62 opened on the base member 61 side. Consequently, an internal space in which the sensor module 2 is housed is formed between the lid member 63 and the base member 61.

A flange 67 is formed in the outer periphery of the opening of the concave section 62 of the lid member 63.

The flange 67 is formed in an annular shape in plan view. The contour on the outer side of the flange 67 in plan view is formed a rectangular shape. The "rectangular shape" is a concept including not only a geometrically accurate rectangular shape but also a shape obtained by cutting at least one corner of the rectangular shape with R-chamfering, C-chamfering, or the like.

The contour of the lid member 63 in plan view, i.e., the contour on the outer side of the flange 67 in plan view includes a pair of first sides 67a and 67b parallel to the x axis direction (a first direction) and a pair of second sides 67c and 67d parallel to the y axis direction (a second direction crossing the first direction). In this embodiment, the R-chamfering is applied to the respective corners of the contour of the lid member 63 in plan view.

The lid member 63 is formed of, for example, a material same as the material of the base member 61 or metal such as Kovar, 42 alloy, or a stainless steel.

The flange 67 of such a lid member 63 is hermetically joined to the upper surface 65 of the base member 61. Consequently, the inside of the package 3 is hermetically sealed.

In this embodiment, the flange 67 and the base member are joined via a joining member 64 formed of metal. Specifically, the joining member 64 is joined to the upper surface 65 of the base member 61 by brazing and soldering and joined to the flange 67 of the lid member 63 by seam welding and energy beam welding (laser welding, electron beam welding, etc.) explained below.

When the base member 61 is formed of metal that can be spread and joined to the flange 67 by the seam welding and the energy beam welding, the joining member 64 can be omitted. In this case, the flange 67 of the lid member 63 is directly joined to the upper surface 65 of the base member 61 by the seam welding and the energy beam welding.

The joining member 64 is formed in a square ring shape along the flange 67 of the lid member 63. The contour of the lid member 63 is formed to overlap the joining member 64 in plan view. Consequently, it is possible to join the base member 61 and the lid member 63 and hermetically seal the inside of the package 3 without depending on a material forming the base member 61. In this embodiment, the flange 67 is provided to be located between the contour on the outer side and the contour on the inner side of the joining member 64 in plan view.

The joining member 64 is spread and joined to the flange 67 by the seam welding and the energy beam welding.

Specifically, as shown in FIG. 5, a joined section 90 of the lid member 63 and the joining member 64 includes a pair of welded sections 91 and 92 (a first welded section) extending in the x axis direction, a pair of welded sections 93 and 94 (a second welded section) extending in the y axis direction, and four welded sections 95 to 98 (a third welded section) locally provided to corresponding to the four corners of the lid member 63. Consequently, such a joined section 90 is formed over the entire periphery of the lid member 63 along the external shape (the contour) of the lid member 63 in plan view.

In FIG. 5, for convenience of explanation, the inside of formation areas of the respective welded sections 91 to 98 is indicated by hatching to clearly show the formation areas. Actually, since the lid member 63 and the joining member 64 spread from each other in the joined section 90 of the lid member 63 and the joining member 64, a boundary between the lid member 63 and the joining member 64 is unclear. However, in FIGS. 1 and 5, for convenience of explanation, a boundary between the lid member 63 and the joining member 64 is shown. The above description is also applied to the other embodiments and figures.

The respective welded sections 91 to 94 are formed in a band shape in plan view and formed by joining the lid member 63 and the joining member 64 along the respective sides of the flange 67 in plan view using the seam welding. Specifically, the pair of first welded sections 91 and 92 are formed by joining the base member 61 and the lid member 63 along the pair of first sides 67a and 67b using the seam welding. The pair of first welded sections 93 and 94 are formed by joining the base member 61 and the lid member 63 along the pair of second sides 67c and 67d using the seam welding. A main portion of the outer periphery of the lid member 63 in plan view and the joining member 64 are hermetically joined by such two pairs of welded sections 91 to 94.

The welded sections 91 to 94 are formed excluding the corners of the flange 67 in plan view and separate from one another.

On the other hand, the respective welded sections 95 to 98 are formed in a spot shape in plan view and formed by joining the lid member 63 and the joining member 64 using the energy beam welding to correspond to the respective corners of the flange 67 in plan view. A portion other than the main portion (i.e., a portion where the two pairs of welded sections 91 to 94 are not formed) in the outer periphery of the lid member 63 in plan view and the joining member 64 are hermetically joined by such four welded sections 95 to 98. A gap locally formed between the base member 61 and the lid member 63 after the seam welding can be easily and surely close under reduced pressure or under inert gas atmosphere.

The welded section 95 is formed to fill a space between the two welded sections 91 and 93 adjacent to each other. A part of a formation area of the welded section 95 partially overlaps formation areas of the welded sections 91 and 93. Similarly, a part of the formation area of the welded section 96 overlaps a part of formation areas of the welded sections 91 and 94. A part of a formation area of the welded section 97 overlaps a part of formation areas of the welded sections 92 and 94. A part of a formation area of the welded section 98 overlaps a part of formation areas of the welded sections 92 and 93.

The two welded sections 91 and 93 adjacent to each other and the welded section 95 formed to fill a space between the two welded sections 91 and 93 are explained in detail below with reference to FIG. 6. Explanation of a relation between the welded sections 91 and 94 and the welded section 96, a relation between the welded sections 92 and 94 and the welded section 97, and a relation between the welded sections 92 and 93 and the welded section 98 is omitted because the relations are the same as a relation between the welded sections 91 and 93 and the welded section 95.

In plan view, the welded section 91 and the welded section 93 do not overlap each other. An area A3 where an area A1 formed by extending the welded section 91 in the x axis direction (the first direction) and an area A2 formed by extending the welded section 93 in the y axis direction (the second direction) overlap each other is located on the outer side with respect to the contour of the lid member 63.

Consequently, it is possible to locally form a gap (a gap 69 shown in FIG. 10) between the base member 61 and the lid member 63 after the seam welding for forming the welded sections 91 to 94. Therefore, it is possible to remove gas generated during the seam welding from the inside of the package 3 and realize high-quality hermetical sealing by closing the gap through welding under reduced pressure or under an inertia gas atmosphere.

In this embodiment, when the width of the flange 67 (i.e., length of projection from the outer periphery of a main body section of the lid member 63) is represented as m and the width of each of the welded sections 91 and 93 is represented as W, a relation W<m is satisfied.

A corner 68 of the flange 67 is R-chamfered as explained above. When a curvature radius of the corner 68 is represented as R, a relation $W<(1-1/\sqrt{2})R$ is satisfied.

According to such relations of W and R, in plan view, the contour of the flange 67 is present on the inner side with respect to the area A3. Specifically, in plan view, the area A3 is present further on the outer side than the contour on the outer side of the flange 67, i.e., the contour of the lid member 63.

Consequently, the welded section 91 and the welded section 93 are formed not to overlap each other. Therefore, in a state in which the welded section 95 is not formed, a gap that communicates with the inside and the outside of the package 3 can be formed between the corner 68 of the lid member 63 and the joining member 64.

A material forming the joining member 64 only has to be metal that can be spread and joined to the flange 67 by the seam welding and the energy beam welding and is not specifically limited. However, for example, a brazing filler material can be suitably used.

The inside of the package 3 configured as explained above is desirably maintained in a decompressed state such that the vibration of the sensor elements 30 of the respective sensor units 101, 102, and 103 is not prevented.

Method of Manufacturing an Electronic Device Package

A method of manufacturing an electronic device package according to this embodiment is explained with reference to a method of manufacturing the package 3 (the sensor device 1) as an example.

Figure 7A:
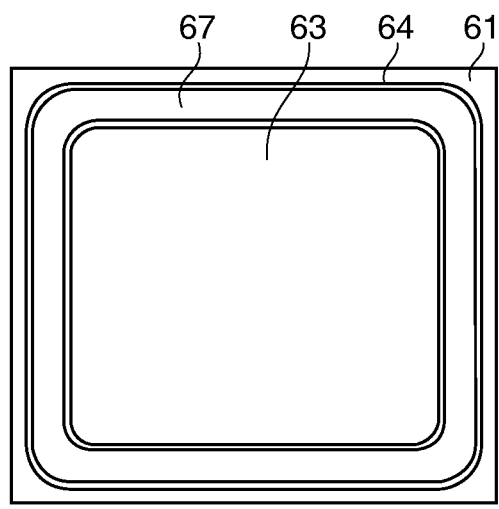
FIGS. 7A to 7C are diagrams for explaining a first joining process in a method of manufacturing an electronic device package (a method of manufacturing a sensor device) according to the first embodiment of the invention.
Figure 7B:
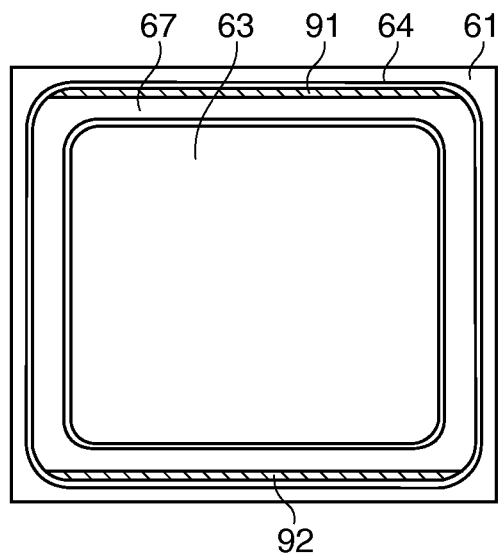
Figure 7C:
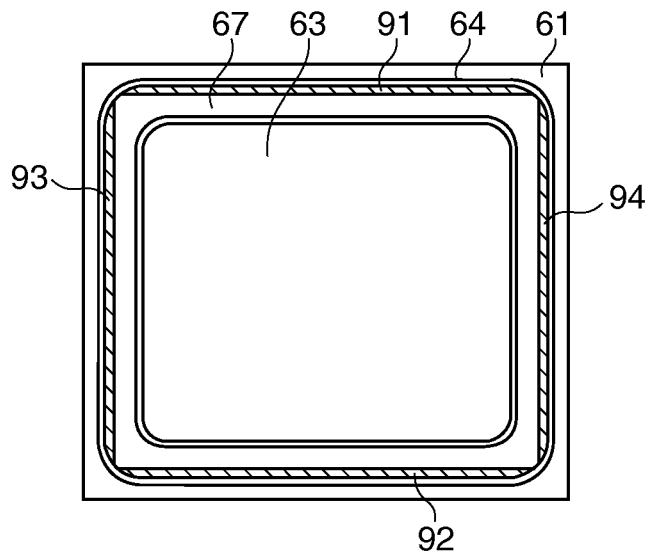
Figure 8:
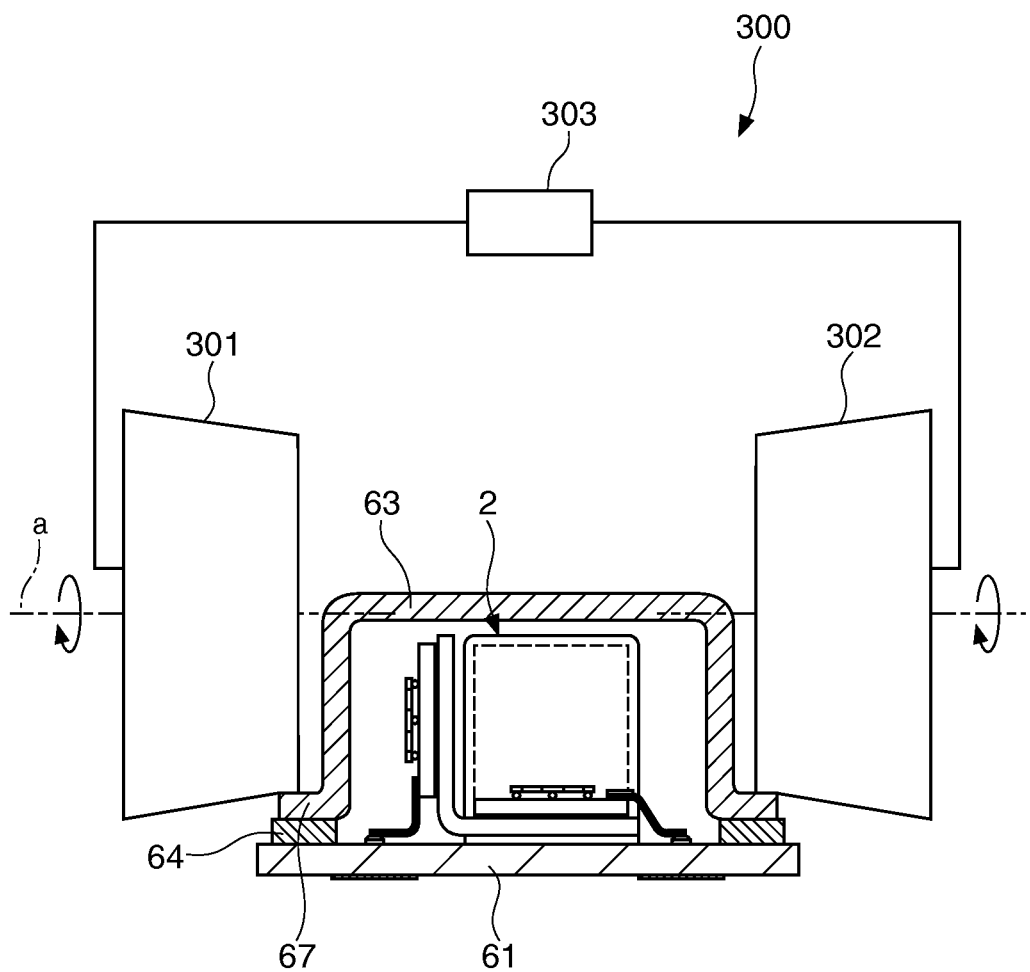
FIG. 8 is a diagram for explaining seam welding used in the first joining process shown in FIGS. 7A to 7C.
Figure 9:
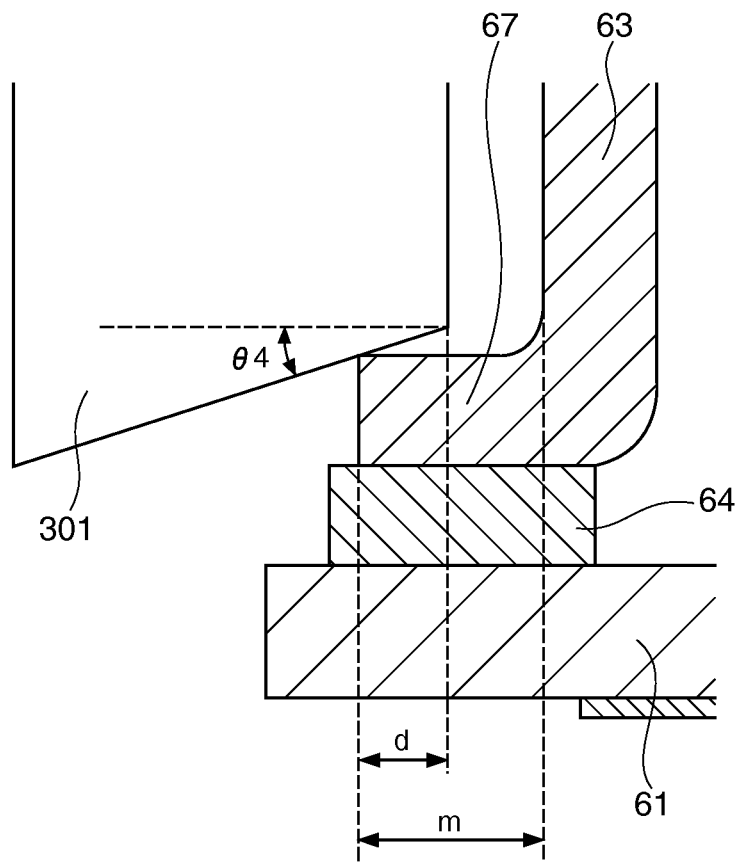
FIG. 9 is a partially enlarged view of FIG. 8.
Figure 10:
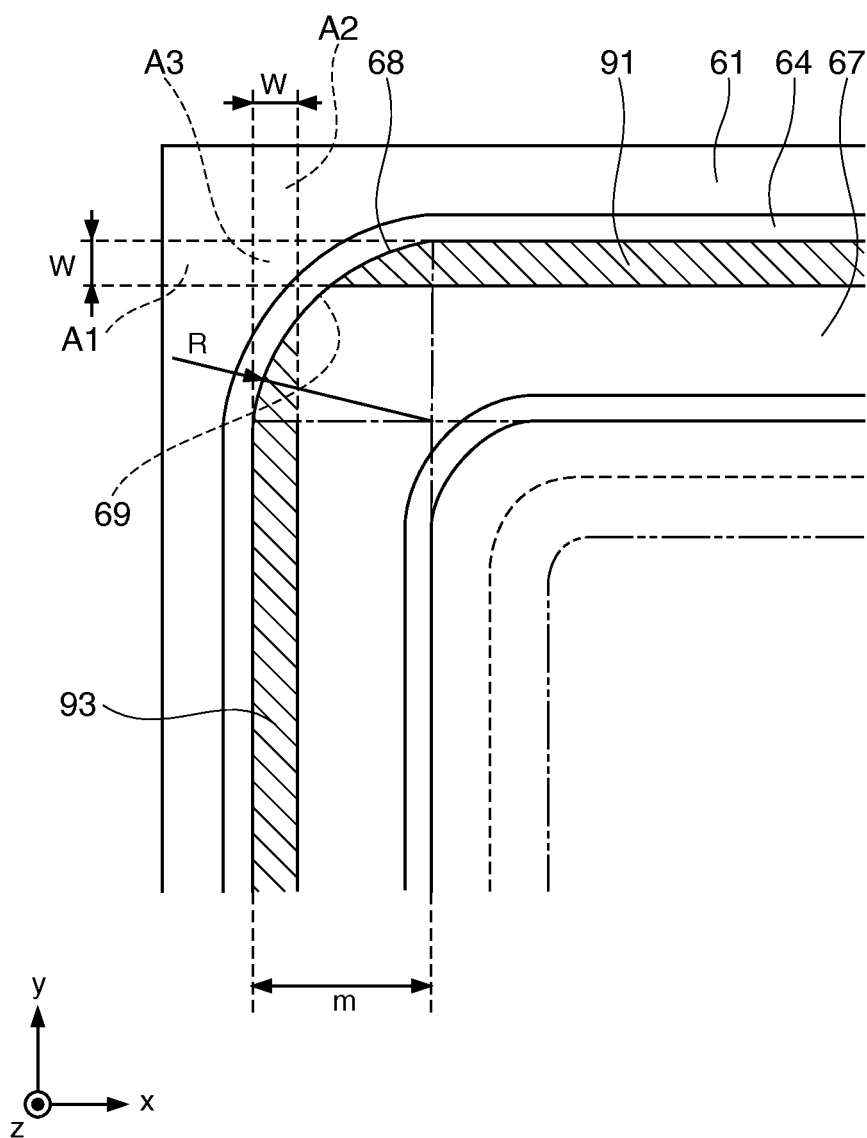
FIG. 10 is a partially enlarged plan view of the package after the first joining process shown in FIGS. 7A to 7C.
Figure 11A:
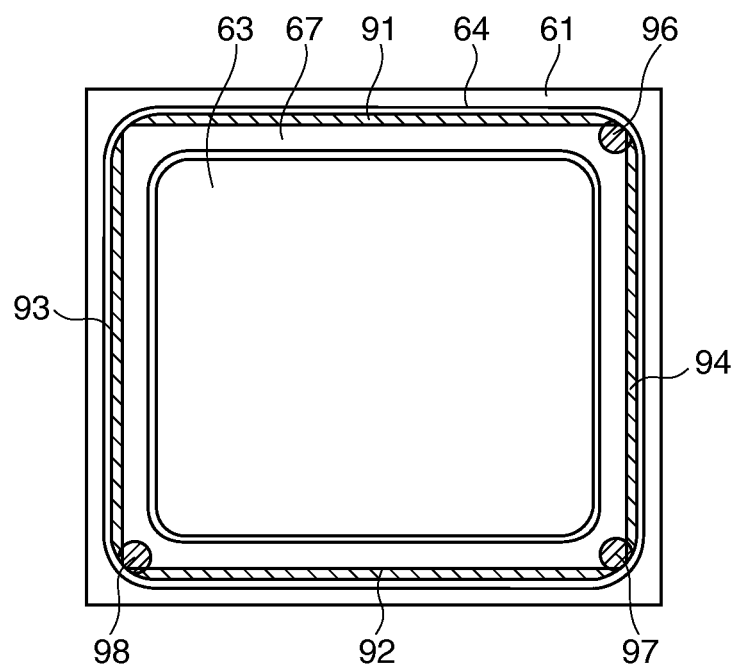
FIGS. 11A and 11B are diagrams for explaining a second joining process in the method of manufacturing an electronic device package (the method of manufacturing a sensor device) according to the first embodiment of the invention.
Figure 11B:
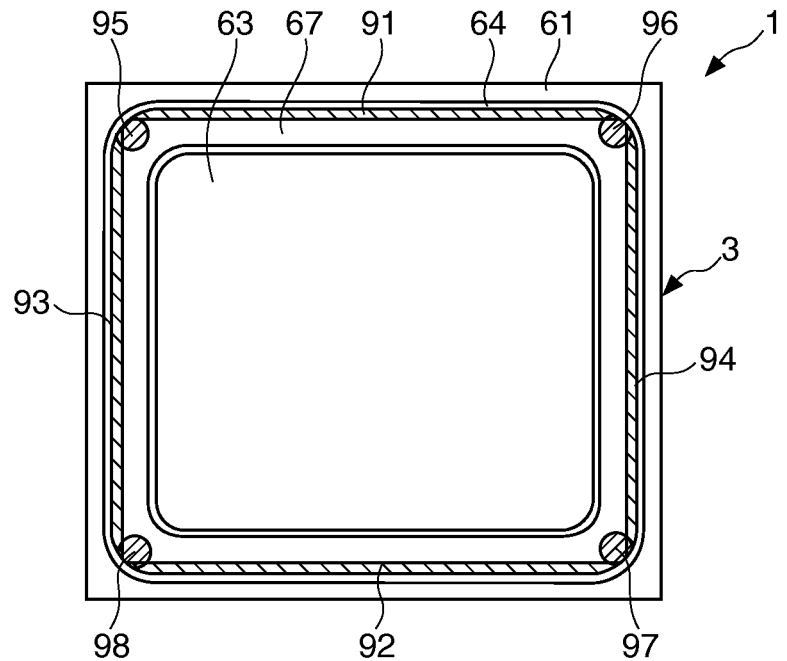

FIGS. 7A to 7C are diagrams for explaining a first joining process in the method of manufacturing an electronic device package (the method of manufacturing a sensor device) according to the first embodiment of the invention. FIG. 8 is a diagram for explaining seam welding used in the first joining process shown in FIGS. 7A to 7C. FIG. 9 is a partially enlarged view of FIG. 8. FIG. 10 is a partially enlarged plan view of the package after the first joining process shown in FIGS. 7A to 7C. FIGS. 11A and 11B are diagrams for explaining a second joining process in the method of manufacturing an electronic device package (the method of manufacturing a sensor device) according to the first embodiment of the invention.

The method of manufacturing the package 3 (the method of manufacturing the sensor device 1) includes [1] a first joining process for joining, using the seam welding, a part of joining planned regions of the base member 61 and the lid member 63 and [2] a second joining process for joining, using the energy beam welding, the remaining part of the joining planned regions of the base member 61 and the lid member 63.

The respective processes of the method of manufacturing the package 3 are sequentially explained in detail below.

[1] First Joining Process 1-1

First, as shown in FIG. 7A, the base member 61 and the lid member 63 are prepared. The lid member 63 is laid over on the upper surface 65 side of the base member 61.

At this point, the joining member 64 is joined to the upper surface 65 of the base member 61 in advance by brazing and soldering. Although not shown in the figure, the sensor module 2 is attached to a surface of the base member 61 on a side where the joining member 64 is provided, i.e., the upper surface 65.

In a state which the flange 67 of the lid member 63 is in contact with the joining member 64, the lid member 63 is placed on the upper surface 65 side of the base member 61.

1-2

Subsequently, as shown in FIG. 7B, the pair of welded sections 91 and 92 are formed by joining the flange 67 and the joining member 64 along a pair of sides parallel to each other in plan view of the flange 67 using the seam welding.

In such seam welding (seam joining), for example, a welding machine 300 shown in FIG. 8 is used.

The welding machine 300 includes a pair of roller electrodes 301 and 302 and a power supply device 303 electrically connected to the pair of roller electrodes 301 and 302.

Each of the pair of roller electrodes is provided to be rotatable about an axis "a" centering on the center axis.

The pair of roller electrodes 301 and 302 separate from each other in a direction parallel to the axis "a".

The pair of roller electrodes 301 and 302 are formed in a taper shape having an outer diameter gradually increasing at a taper angle θ4 from the inner side to the outer side.

The taper angle θ4 is not specifically limited. However, the taper angle θ4 is desirably equal to or larger than 5° and equal to or smaller than 25° and more desirably equal to or larger than 10° and equal to or smaller than 20°. Consequently, it is possible to realize stabilization of a contact state of the roller electrodes 301 and 302 and the flange 67. As a result, it is possible to prevent a welding failure.

Such a pair of roller electrodes 301 and 302 are pressed and brought into contact with the flange 67 of the lid member 63 from the opposite side of the base member 61 by a not-shown pressing mechanism. The pair of roller electrodes 301 and 302 travel at predetermined speed along a pair of sides parallel to each other of the flange 67 in plan view while rotating about the axis "a".

At this point, the power supply device 303 feeds an electric current to between the roller electrode 301 and the roller electrode 302 via the lid member 63 and the joining member 64. Consequently, the joining member 64 is melted by Joule heat to join the flange 67 of the lid member 63 and the joining member 64.

The overlapping length of each of the roller electrodes 301 and 302 and the flange 67 in the direction parallel to the axis "a" is represented as d, the width of the flange 67 is represented as m, and the width of each of the welded sections 91 and 92 is represented as W, a relation W≤d<m is satisfied (see FIG. 9).

The respective corners of the flange 67 in plan view are R-chamfered as explained above. When a curvature radius of the R-chamfering is represented as R, a relation d<(1-1/√2)R is satisfied.

According to such relations of d and R, concerning the respective welded sections 91 and 92, a relation W<(1-1/√2)R is satisfied.

1-3

Subsequently, as shown in FIG. 7C, the pair of welded sections 93 and 94 are formed by joining, using the seam welding, the flange 67 and the joining member 64 along the remaining pair of sides parallel to each other of the flange 67 in plan view.

Such seam welding can be performed in the same manner as the formation of the pair of welded sections 91 and 92.

Like the pair of welded sections 91 and 92, when the overlapping length of each of the roller electrodes 301 and 302 and the flange 67 in the direction parallel to the axis "a" is represented as d, the width of the flange 67 is represented as m, and the width of each of the welded sections 93 and 94 is represented as W, a relation W≤d<m is satisfied (see FIG. 10).

The respective corners of the flange 67 in plan view are R-chamfered as explained above. When a curvature radius of the R-chamfering is represented as R, a relation d<(1-1/√2)R is satisfied.

According to such relations of d and R, concerning the respective welded sections 93 and 94, a relation W<(1-1/√2)R is satisfied.

As explained above, concerning the welded sections 91 to 94, the pair of welded sections 91 and 92 and the pair of welded sections 93 and 94 are formed to satisfy the relation W<(1-1/√2)R. Consequently, the welded sections 91 to 94 are formed not to overlap one another. Portions (gaps) not seam-welded are formed at the respective corners 68 of the flange 67.

The welded sections 91 and 93 are representatively explained more specifically. As shown in FIG. 10, in plan view, the area A3 where the area A1 formed by extending the welded section 91 along the x axis direction and the area A2 formed by extending the welded section 93 along the y axis direction overlap each other is present further on the outer side than the contour on the outer side of the flange 67, i.e., the contour of the lid member 63.

Therefore, the welded section 91 and the welded section 93 do not overlap each other. The gap 69 that communicate with the inside and the outside of the package 3 is formed between the corner 68 of the lid member 63 and the joining member 64.

[2] Second Joining Process 2-1

Subsequently, as shown in FIG. 11A, the three welded sections 96 to 98 are formed by joining, using the energy beam welding, the three corners 68 among the four corners 68 of the flange 67 and the joining member 64. Consequently, at such three corners 68, the gap 69 is closed by welding.

Such energy beam welding is performed by irradiating an energy beam such as a laser beam or an electron beam on the three corners 68.

Such energy beam welding may continuously oscillate the energy beam or may pulse-oscillate the energy beam.

An atmosphere in performing such energy beam welding is not specifically limited. The energy beam welding may be performed either under the atmospheric pressure, under reduced pressure, or under an inert gas atmosphere.

A spot diameter of the energy beam on the corner 68 during such energy beam welding is not specifically limited as long as the gap 69 can be closed by welding. However, the spot diameter is desirably equal to or larger than the width of the gap 69 and equal to or smaller than the width of the flange 67.

2-2

Subsequently, as shown in FIG. 11B, the welded section 95 is formed by joining, using the energy beam welding, the remaining one corner 68 among the four corners 68 of the flange 67 and the joining member 64. Consequently, at the remaining one corner 68, the gap 69 is closed by welding.

Such energy beam welding can be performed by a method same as the method of the energy beam welding in the step 2-1 explained above.

The energy beam welding in this process is desirably performed under reduced pressure or under an inert gas atmosphere. Consequently, it is possible to hermetically seal the inside of the obtained package 3 in a decompressed state or an inert gas encapsulated state. Further, it is possible to prevent gas generated during the seam welding from remaining in the obtained package 3.

With the method of manufacturing the package 3 explained above, since the package 3 is hermetically sealed by performing the local energy beam welding after the seam welding. Therefore, it is possible to remove, from the inside of the package 3, gas generated during the energy beam welding or during the seam welding before the energy beam welding. Since the energy beam welding is local, it is possible to prevent or suppress gas generated during the energy beam welding from remaining in the package 3. Therefore, it is possible to obtain the package 3 hermetically sealed in high quality.

Before the joining of the base member 61 and the lid member 63, it is unnecessary to form a through-hole in the base member 61 and the lid member 63. A sealing material for closing the through-hole is also unnecessary. Therefore, a manufacturing process is simplified and material expenses can be held down. Consequently, it is possible to realize a reduction in costs of the package 3 and a reduction in costs of the sensor device 1.

Since the through-hole and the sealing material are unnecessary, a degree of freedom of arrangement of an electronic component, a wire, an electrode, and the like in the package 3 increases. It is also possible to realize a reduction in size of the package 3.

With the package 3 and the sensor device 1 according to the first embodiment explained above, it is possible to realize a reduction in costs and realize high-quality hermetical sealing.

Second Embodiment

A second embodiment of the invention is explained.

Figure 12:
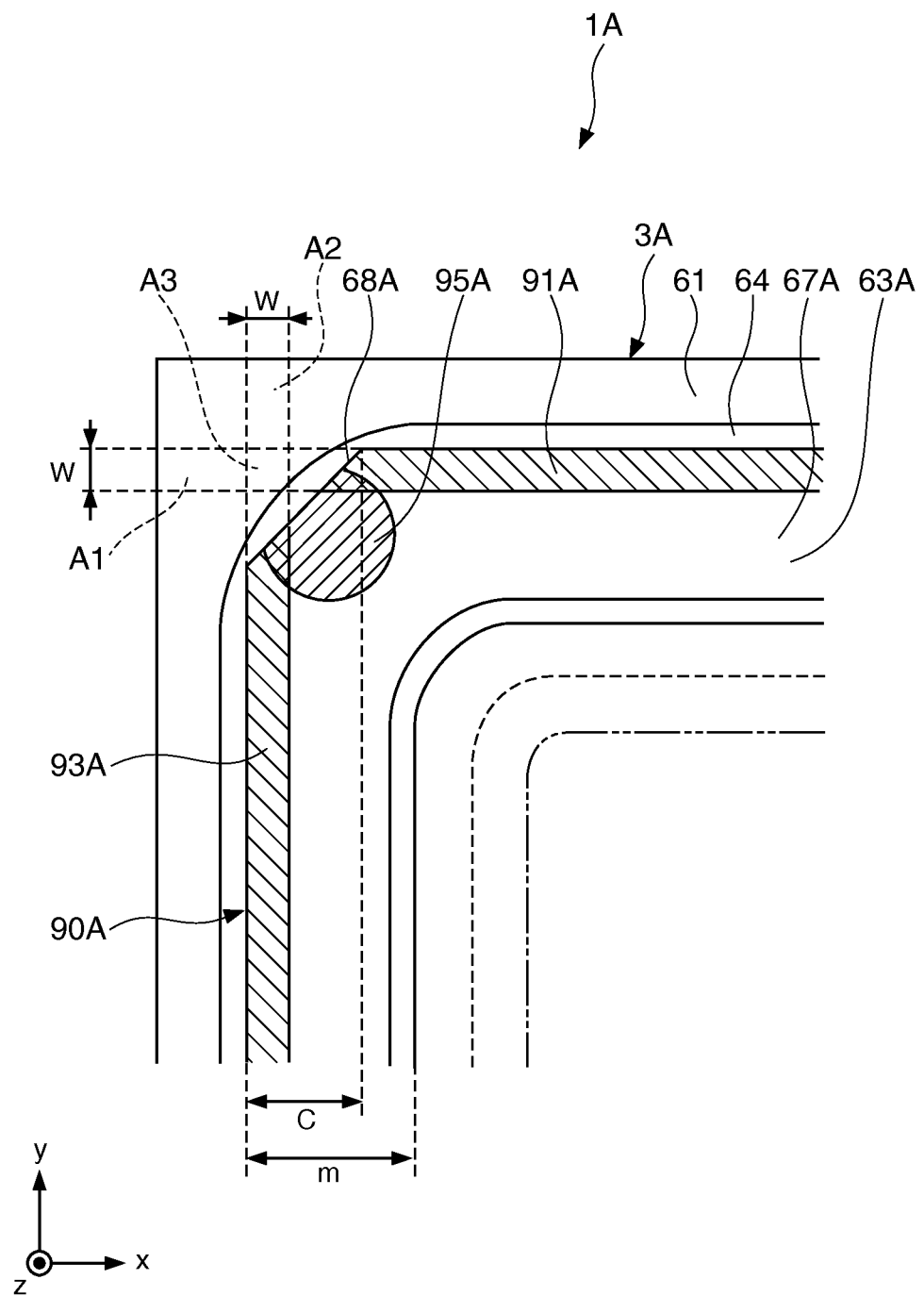
FIG. 12 is a partially enlarged plan view of a package of a sensor device (an electronic device) according to a second embodiment of the invention.
Figure 13:
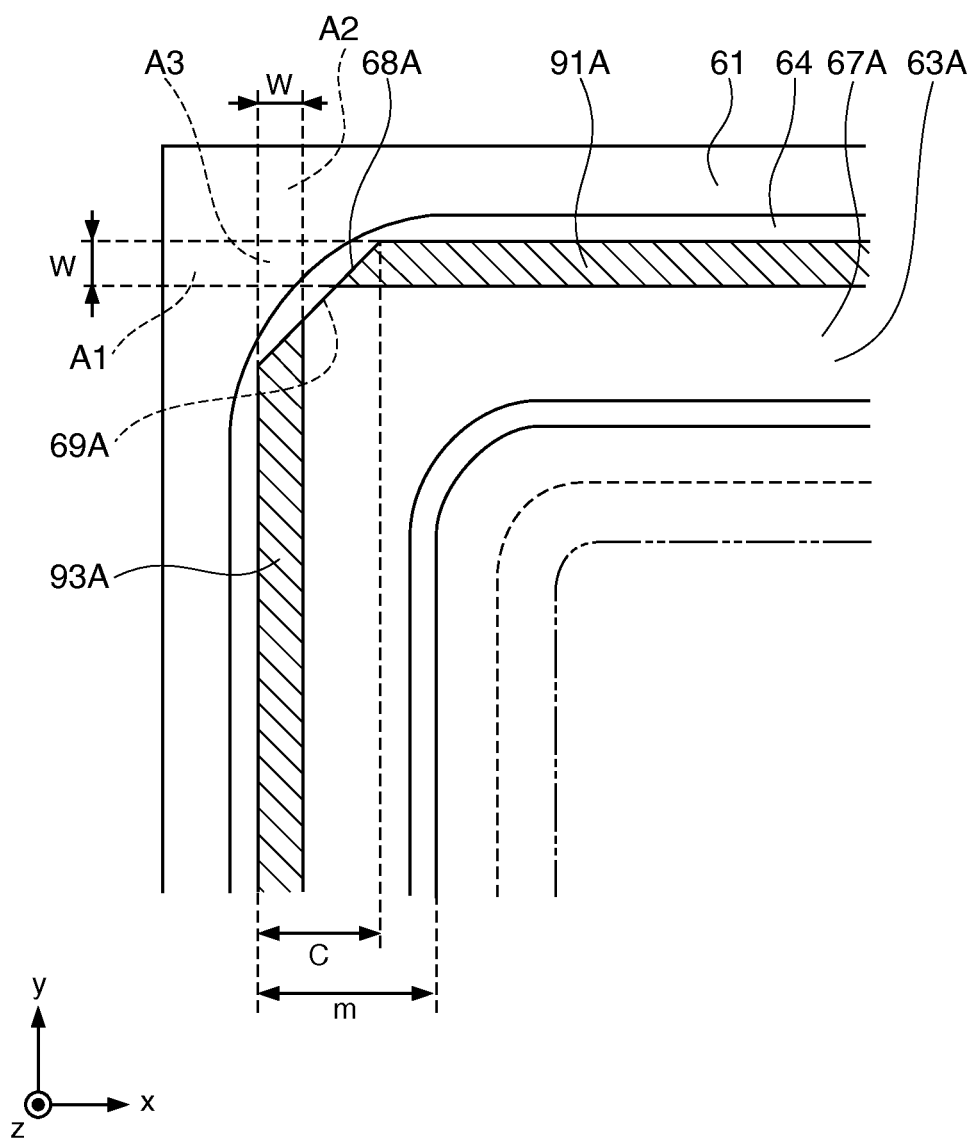
FIG. 13 is a partially enlarged plan view of the package after a first joining process in a method of manufacturing an electronic device package (a method of manufacturing a sensor device) according to the second embodiment of the invention.

FIG. 12 is a partially enlarged plan view of a package of a sensor device (an electronic device) according to the second embodiment of the invention. FIG. 13 is a partially enlarged plan view of the package after a first joining process in a method of manufacturing an electronic device package (a method of manufacturing a sensor device) according to the second embodiment of the invention.

The sensor device according to this embodiment is the same as the sensor device according to the first embodiment except that the configuration of a flange of a package is different.

In the following explanation, concerning the sensor device according to the second embodiment, differences from the first embodiment are mainly explained. Explanation of similarities is omitted. In FIGS. 12 and 13, components same as the components in the first embodiment are denoted by the same reference numerals and signs.

As shown in FIG. 12, a sensor device 1A according to this embodiment includes a package 3A.

The package 3A includes the flat base member 61 and a lid member 63A (a cap) including the concave section 62.

A flange 67A is formed in the outer periphery of an opening of the concave section 62 of the lid member 63A.

C-chamfering is applied to respective corners 68A of a contour of the lid member 63A in plan view.

The flange 67A and the base member 61 are joined via the joining member 64.

Specifically, as shown in FIG. 12, a joined section 90A of the lid member 63A and the joining member 64 includes a welded section 91A extending in the x axis direction, a welded section 93A extending in the y axis direction, and a welded section 95A locally provided to correspond to the corner 68A of the lid member 63A. Although not shown in the figure, such a joined section 90A is formed over the entire periphery of the lid member 63A along the external shape (the contour) of the lid member 63A in plan view.

The welded sections 91A and 93A are formed by joining the lid member 63A and the joining member 64 using seam welding.

On the other hand, the welded section 95A is formed by joining the lid member 63A and the joining member 64 using energy beam welding.

When the width of the flange 67A (i.e., length of projection from the outer periphery of a main body section of the lid member 63A) is represented as m and the width of each of the welded sections 91A and 93A is represented as W, a relation W<m is satisfied.

The corner 68A of the flange 67A is C-chamfered as explained above. When a chamfering dimension of the C-chamfering is represented as C, a relation W<C/2 is satisfied.

According to such relations of W and C, in plan view, the area A3 where the area A1 formed by extending the welded section 91A along the x axis direction and the area A2 formed by extending the welded section 93A along the y axis direction overlap each other is present further on the outer side than the contour of the lid member 63A.

Consequently, the welded section 91A and the welded section 93A are formed not to overlap each other. Therefore, in a state in which the welded section 95A is not formed, as shown in FIG. 13, a gap 69A that communicates with the inside and the outside of the package 3A can be formed between the corner 68A of the lid member 63A and the joining member 64.

With the package 3A and the sensor device 1A according to the second embodiment explained above, it is possible to realize a reduction in costs and realize high-quality hermetical sealing.

Third Embodiment

A third embodiment of the invention is explained.

Figure 14:
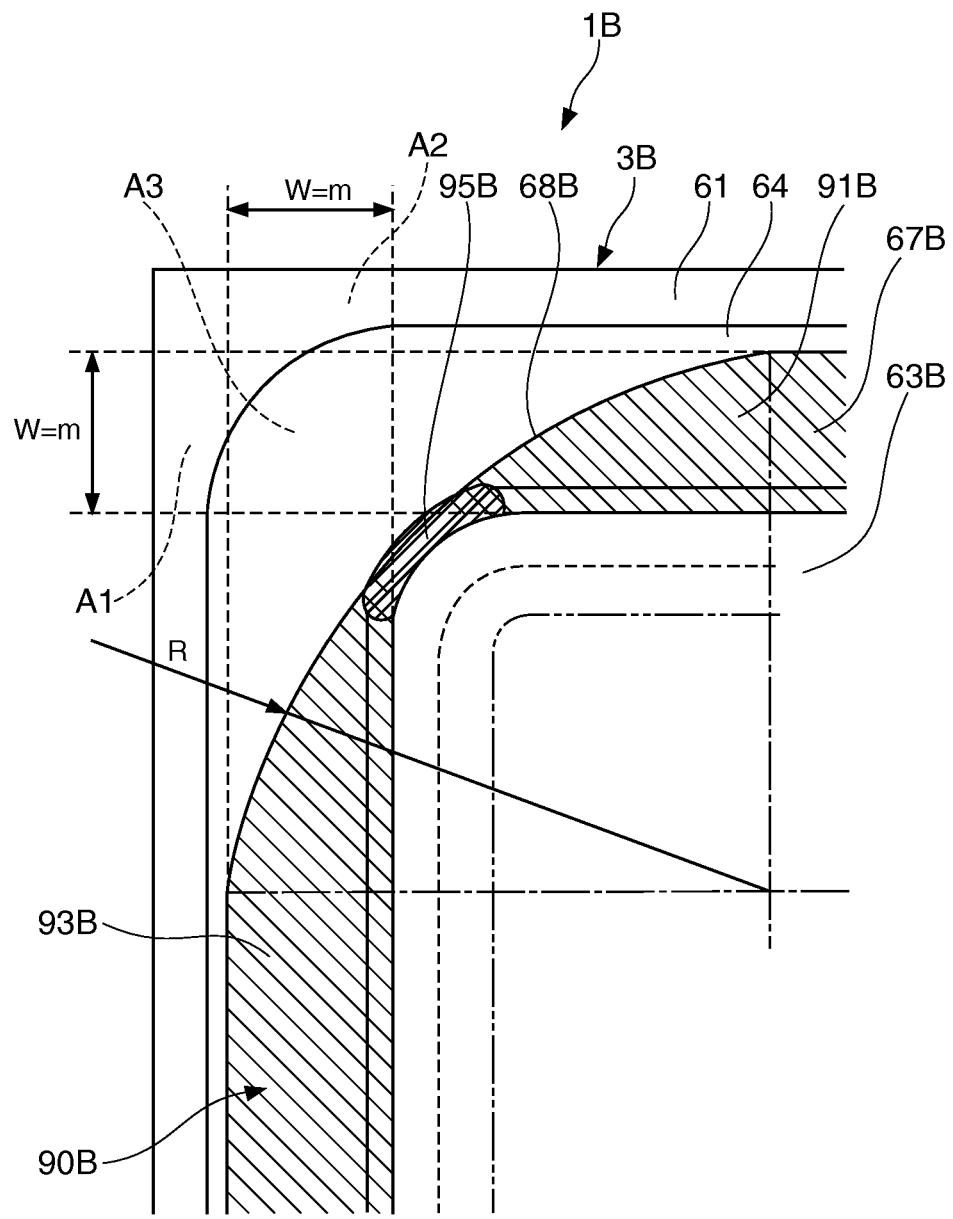
FIG. 14 is a partially enlarged plan view of a package of a sensor device (an electronic device) according to a third embodiment of the invention.
Figure 15:
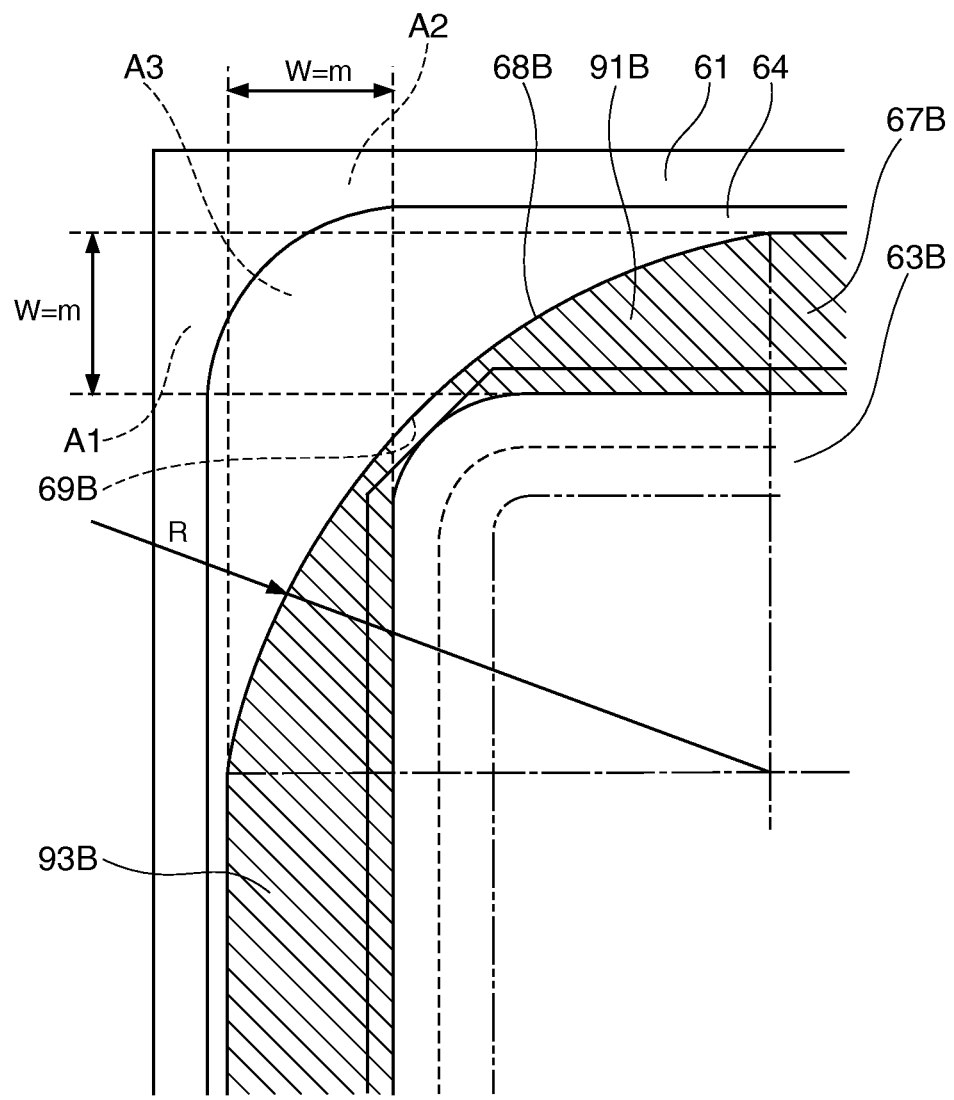
FIG. 15 is a partially enlarged plan view of the package after a first joining process in a method of manufacturing an electronic device package (a method of manufacturing a sensor device) according to the third embodiment of the invention.

FIG. 14 is a partially enlarged plan view of a package of a sensor device (an electronic device) according to a third embodiment of the invention. FIG. 15 is a partially enlarged plan view of the package after a first joining process in a method of manufacturing an electronic device package (a method of manufacturing a sensor device) according to the third embodiment of the invention.

The sensor device according to this embodiment is the same as the sensor device according to the first embodiment except that the configuration of a flange of a package is different.

In the following explanation, concerning the sensor device according to the third embodiment, differences from the first and second embodiments are mainly explained. Explanation of similarities is omitted. In FIGS. 14 and 15, components same as the components in the first and second embodiments are denoted by the same reference numerals and signs.

As shown in FIG. 14, a sensor device 1B according to this embodiment includes a package 3B.

The package 3B includes the flat base member 61 and a lid member 63B (cap) including the concave section 62.

A flange 67B is formed in the outer periphery of an opening of the concave section 62 of the lid member 63B.

R-chamfering is applied to respective corners 68B of the contour of the lid member 63B in plan view.

The flange 67B and the base member 61 are joined via the joining member 64.

Specifically, as shown in FIG. 14, a joined section 90B of the lid member 63B and the joining member 64 includes a welded section 91B extending in the x axis direction, a welded section 93B extending in the y axis direction, and a welded section 95B locally provided to correspond to the corner 68B of the lid member 63B. Although not shown in the figure, such a joined section 90B is formed over the entire periphery of the lid member 63B along the external shape (the contour) of the lid member 63B in plan view.

The welded sections 91B and 93B are formed by joining the lid member 63B and the joining member 64 using seam welding.

On the other hand, the welded section 95B is formed by joining the lid member 63B and the joining member 64 using energy beam welding.

When the width of the flange 67B (i.e., length of projection from the outer circumference of a main body section of the lid member 63B) is represented as m and the width of each of the welded sections 91B and 93B is represented as W, a relation W≤m is satisfied. In FIG. 14, a relation W=m is satisfied.

The corner 68B of the flange 67B is R-chamfered as explained above. When a curvature radius of the R-chamfering is represented as R, a relation $m<(1-1/\sqrt{2})R$ is satisfied.

According to such relations of W and R, even if the relation W=m is satisfied, in plan view, the area A3 where the area A1 formed by extending the welded section 91B along the x axis direction and the area A2 formed by extending the welded section 93B along the y axis direction overlap each other is present further on the outer side than the contour of the lid member 63B.

Consequently, the welded section 91B and the welded section 93B are formed not to overlap each other. Therefore, in a state in which the welded section 95B is not formed, as shown in FIG. 15, a gap 69B that communicates with the inside and the outside of the package 3B can be formed between the corner 68B of the lid member 63B and the joining member 64.

In particular, by satisfying the relation $m<(1-1/\sqrt{2})R$, during the seam welding, even in a state in which a roller electrode is in contact with the outer periphery of the main body section of the lid member 63B, i.e., even if overlapping length (d) of the roller electrode and the lid member 63B is maximized, the gap 69B can be formed. Therefore, it is possible to easily and surely form the gap 69B.

With the package 3B and the sensor device 1B according to the third embodiment explained above, as in the first and second embodiments, it is possible to realize a reduction in costs and realize high-quality hermetical sealing.

Fourth Embodiment

A fourth embodiment of the invention is explained.

Figure 16:
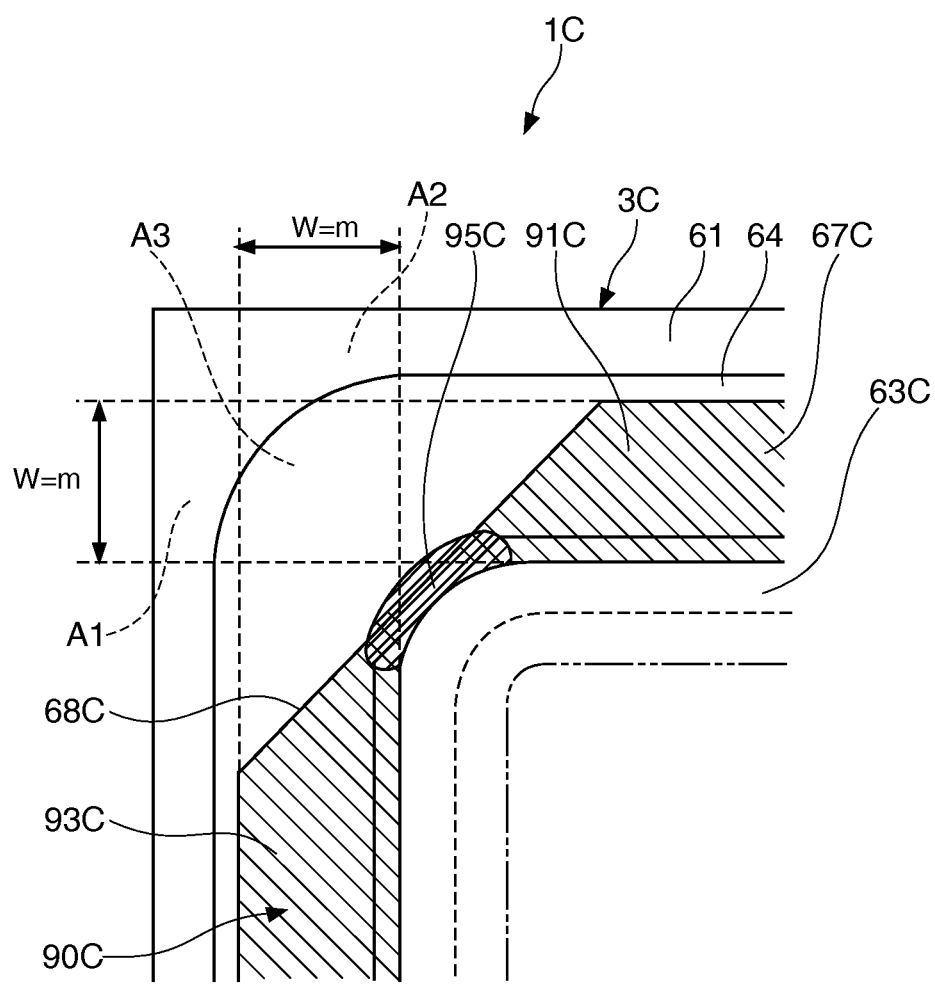
FIG. 16 is a partially enlarged plan view of a package of a sensor device (an electronic device) according to a fourth embodiment of the invention.
Figure 17:
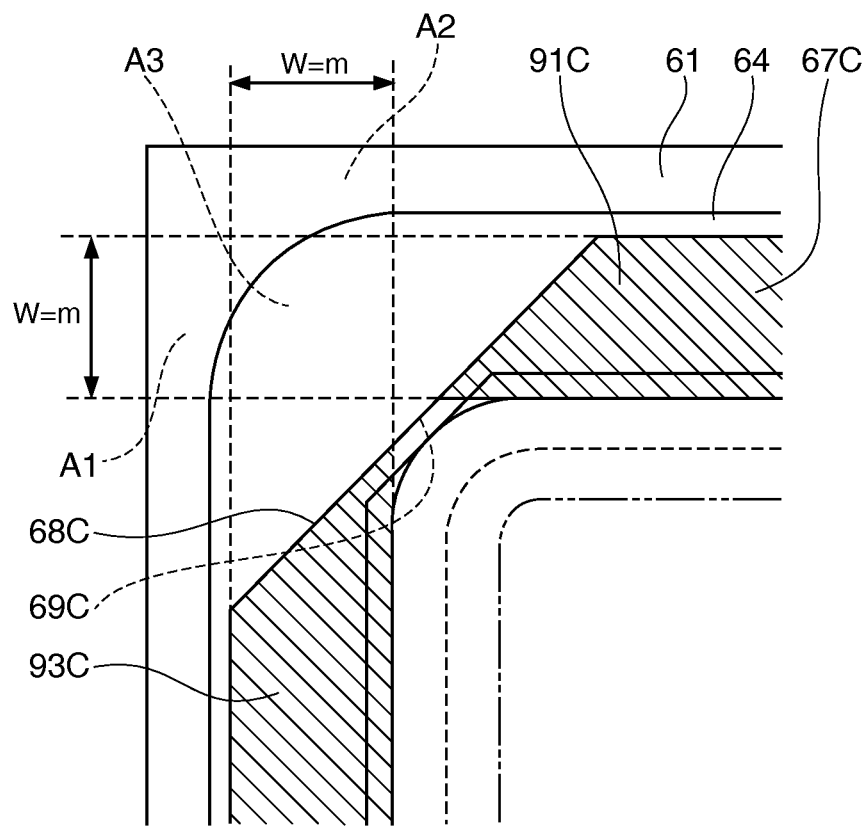
FIG. 17 is a partially enlarged plan view of the package after a first joining process in a method of manufacturing an electronic device package (a method of manufacturing a sensor device) according to the fourth embodiment of the invention.

FIG. 16 is a partially enlarged plan view of a package of a sensor device (an electronic device) according to the fourth embodiment of the invention. FIG. 17 is a partially enlarged plan view of the package after a first joining process in a method of manufacturing an electronic device package (a method of manufacturing a sensor device) according to the fourth embodiment of the invention.

The sensor device according to this embodiment is the same as the sensor device according to the first embodiment except that the configuration of a flange of a package is different.

In the following explanation, concerning the sensor device according to the fourth embodiment, differences from the first to third embodiments are mainly explained. Explanation of similarities is omitted. In FIGS. 16 and 17, components same as the components in the first to third embodiments are denoted by the same reference numerals and signs.

As shown in FIG. 16, a sensor device 1C according to this embodiment includes a package 3C.

The package 3C includes the flat base member 61 and a lid member 63C (cap) including the concave section 62.

A flange 67C is formed in the outer periphery of an opening of the concave section 62 of the lid member 63C.

C-chamfering is applied to respective corners 68C of the contour of the lid member 63C in plan view.

The flange 67C and the base member 61 are joined via the joining member 64.

Specifically, as shown in FIG. 16, a joined section 90C of the lid member 63C and the joining member 64 includes a welded section 91C extending in the x axis direction, a welded section 93C extending in the y axis direction, and a welded section 95C locally provided to correspond to the corner 68C of the lid member 63C. Although not shown in the figure, such a joined section 90C is formed over the entire periphery of the lid member 63C along the external shape (the contour) of the lid member 63C in plan view.

The welded sections 91C and 93C are formed by joining the lid member 63C and the joining member 64 using seam welding.

On the other hand, the welded section 95C is formed by joining the lid member 63C and the joining member 64 using energy beam welding.

When the width of the flange 67C (i.e., length of projection from the outer circumference of a main body section of the lid member 63C) is represented as m and the width of each of the welded sections 91C and 93C is represented as W, a relation $W \leq m$ is satisfied. In FIG. 16, a relation $W=m$ is satisfied.

The corner 68C of the flange 67C is C-chamfered as explained above. When a chamfering dimension of the C-chamfering is represented as C, a relation $m<C/2$ is satisfied.

According to such relations of W and C, even if the relation $W=m$ is satisfied, in plan view, the area A3 where the area A1 formed by extending the welded section 91C along the x axis direction and the area A2 formed by extending the welded section 93C along the y axis direction overlap each other is present further on the outer side than the contour of the lid member 63C.

Consequently, the welded section 91C and the welded section 93C are formed not to overlap each other. Therefore, in a state in which the welded section 95C is not formed, as shown in FIG. 17, a gap 69C that communicates with the inside and the outside of the package 3C can be formed between the corner 68C of the lid member 63C and the joining member 64.

In particular, by satisfying the relation $m<C/2$, during the seam welding, even in a state in which a roller electrode is in contact with the outer periphery of the main body section of the lid member 63C, i.e., even if overlapping length (d) of the roller electrode and the lid member 63C is maximized, the gap 69C can be formed. Therefore, it is possible to easily and surely form the gap 69C.

With the package 3C and the sensor device 1C according to the fourth embodiment, as in the first to third embodiments, it is possible to realize a reduction in costs and realize high-quality hermetical sealing.

The sensor devices according to the embodiments explained above can be used while being incorporated in various electronic apparatuses.

With such electronic apparatuses, it is possible to realize a reduction in costs and improve reliability.

Electronic Apparatus

An example of an electronic apparatus including an electronic device according to an embodiment of the invention is explained in detail with reference to FIGS. 18 to 20.

Figure 18:
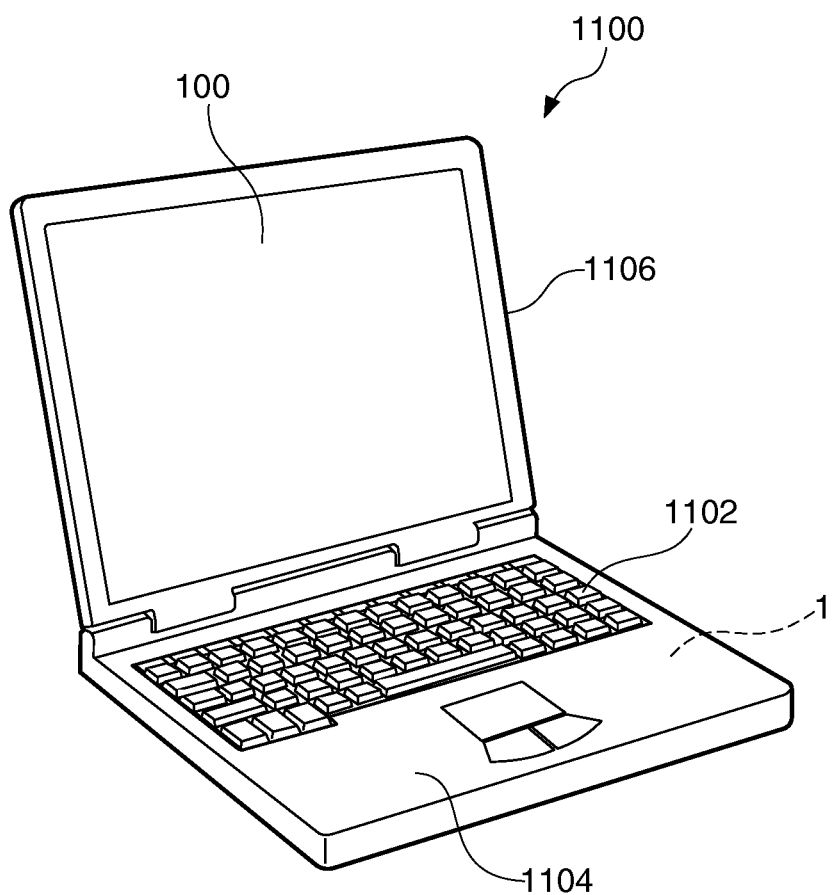
FIG. 18 is a perspective view showing the configuration of a mobile (or notebook) personal computer to which an electronic apparatus according to an embodiment of the invention is applied.

FIG. 18 is a perspective view showing the configuration of a mobile (or notebook) personal computer to which the electronic apparatus according to the embodiment is applied.

In the figure, a personal computer 1100 includes a main body section 1104 including a keyboard 1102 and a display unit 1106 including a display section 100. The display unit 1106 is supported to be pivotable via a hinge structure section with respect to the main body section 1104.

In such a personal computer 1100, the sensor device 1 explained above functioning as the gyro sensor is incorporated.

Figure 19:
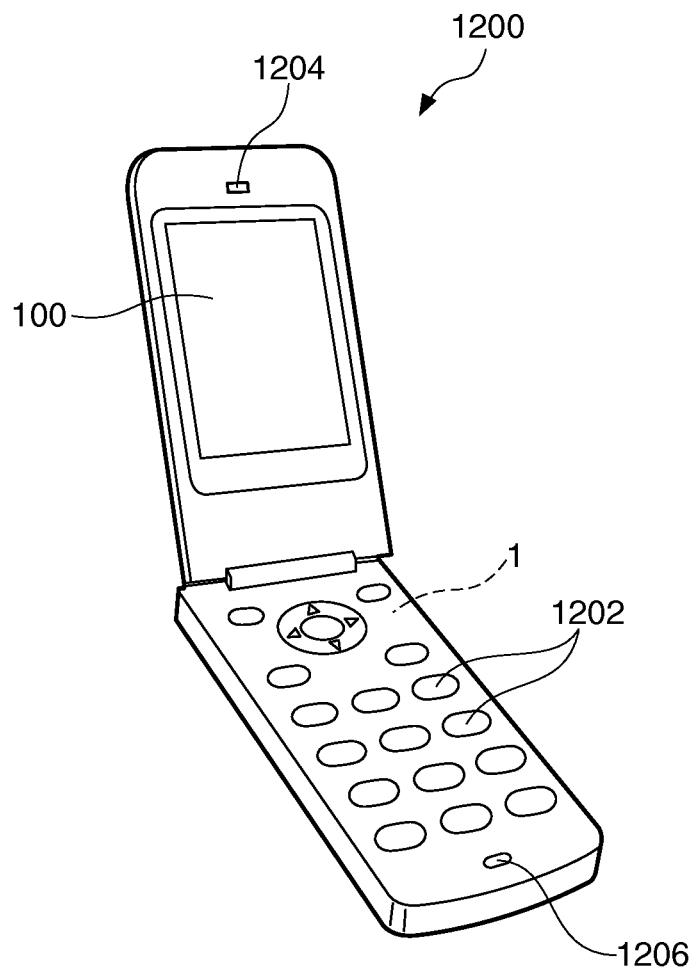
FIG. 19 is a perspective view showing the configuration of a cellular phone (including a PHS) to which the electronic apparatus according to the embodiment of the invention is applied.

FIG. 19 is a perspective view showing the configuration of a cellular phone (including a PHS) to which the electronic apparatus according to the embodiment is applied.

In the figure, the cellular phone 1200 includes plural operation buttons 1202, an earpiece 1204, and a mouthpiece 1206. A display section 100 is arranged between the operation buttons 1202 and the earpiece 1204.

In such a cellular phone 1200, the sensor device 1 explained above functioning as a gyro sensor is incorporated.

Figure 20:
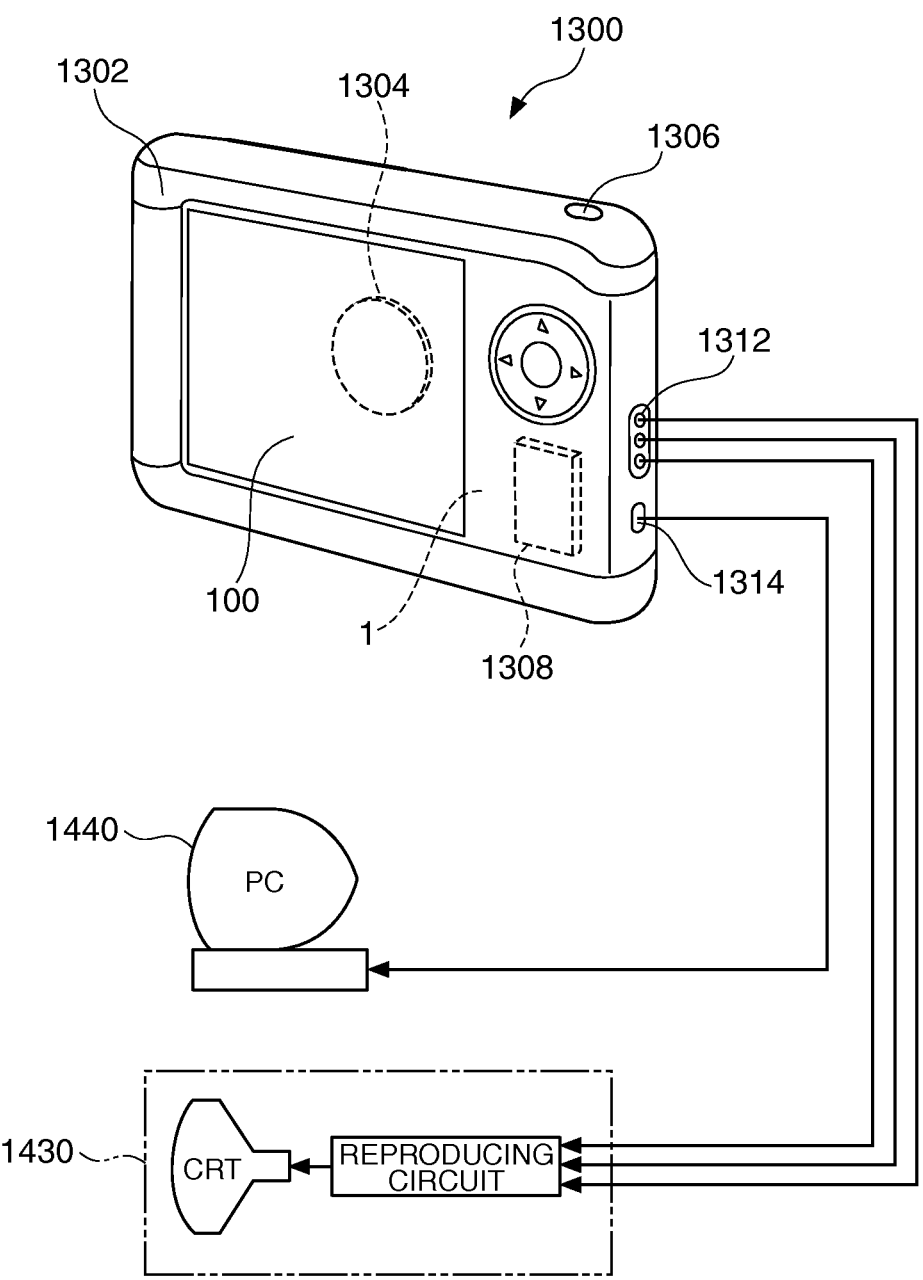
FIG. 20 is a perspective view showing the configuration of a digital still camera to which the electronic apparatus according to the embodiment of the invention is applied.

FIG. 20 is a perspective view showing the configuration of a digital still camera to which the electronic apparatus according to the embodiment is applied. In the figure, connection to external apparatuses is also briefly shown.

Whereas a normal camera exposes a silver halide photograph film to light using an optical image of a subject, the digital still camera 1300 photoelectrically converts the optical image of the subject with an imaging device such as a CCD (Charge Coupled Device) and generates an imaging signal (an image signal).

A display section is provided on the rear surface of a case (a body) 1302 in the digital still camera 1300. The digital still camera 1300 is configured to perform display on the basis of the imaging signal by the CCD. The display section functions as a finder that displays the subject as an electronic image.

On the front surface side (the rear surface side in the figure) of the case 1302, a light receiving unit 1304 including an optical lens (an imaging optical system) and a CCD is provided.

When a photographer checks a subject image displayed on the display section and depresses a shutter button 1306, an imaging signal of the CCD at that point is transferred to and stored in a memory 1308.

In the digital still camera 1300, a video signal output terminal 1312 and an input and output terminal 1314 for data communication are provided on a side surface of the case 1302. As shown in the figure, a television monitor 1430 and a personal computer 1440 are respectively connected to the video signal output terminal 1312 and the input and output terminal 1314 for data communication according to necessity. Further, the imaging signal stored in the memory 1308 is output to the television monitor 1430 and the personal computer 1440 by predetermined operation.

In such a digital still camera 1300, the sensor device 1 explained above functioning as the gyro sensor is incorporated.

Besides the personal computer (the mobile personal computer) shown in FIG. 18, the cellular phone shown in FIG. 19, and the digital still camera shown in FIG. 20, the electronic apparatus according to the embodiment can be applied to, according to types of electronic devices, for example, a car body posture detecting apparatus, a pointing device, a head mounted display, an inkjet type ejecting apparatus (e.g., an inkjet printer), a laptop personal computer, a television, a video camera, a video tape recorder, a navigation apparatus, a pager, an electronic notebook (including an electronic notebook with a communication function), an electronic dictionary, an electric calculator, an electronic game apparatus, a game controller, a word processor, a work station, a television phone, a security television monitor, an electronic binocular, a POS terminal, medical equipment (e.g., an electronic clinical thermometer, a blood pressure meter, a blood glucose meter, an electrocardiogram measuring apparatus, an ultrasonic diagnosis apparatus, and an electronic endoscope), a fish finder, various measuring apparatuses, meters (e.g., meters for a vehicle, an airplane, and a ship), and a flight simulator.

The electronic device package, an electronic device, and an electronic apparatus according to the embodiments of the invention are explained above. However, the invention is not limited to these.

In the electronic device package, the electronic device, and the electronic apparatus according to the embodiments, the components of the sections can be replaced arbitrary components that display the same functions. Further, arbitrary components can be added.

In the electronic device package, the electronic device, and the electronic apparatus according to the embodiments, the arbitrary components in the embodiments may be combined.

In the example explained in the embodiments, the main part (the substrate) of the sensor element 30 is formed of quartz. However, this is not a limitation. The main part (the substrate) of the sensor element 30 may be, for example, a piezoelectric substance such as lithium tantalate ($LiTaO_3$), lithium tetraborate ($Li_2B4O_7$), lithium niobate ($LiNbO_3$), lead zirconatetitanate (PZT), zinc oxide (ZnO), or aluminum nitride (AlN) or a semiconductor such as silicon (Si).

As the sensor element 30, besides the double T type explained above, various gyro elements such as a bipod tuning fork, a tripod tuning fork, an H type tuning fork, a comb tooth type, an orthogonal type, and a square pillar type can be used.

The sensor element 30 may be a gyro sensor element other than the vibration type.

A driving method and a detecting method for vibration of the sensor element 30 may be methods by an electrostatic type that makes use of Coulomb force and methods by a Lorentz type that makes use of magnetic force besides methods by a piezoelectric type that uses a piezoelectric effect of a piezoelectric substance.

The detection axis of the sensor element may be an axis parallel to the principal plane of the sensor element besides the axis orthogonal to the principal plane (the plate surface) of the sensor element.

In the embodiments explained above, the vibrating gyro element is explained as the example of the sensor element of the sensor module. However, this is not a limitation. For example, the sensor element may be an acceleration sensing element that reacts to acceleration, a pressure sensing element that reacts to pressure, or a weight sensing element that reacts to weight. Specifically, the electronic device according to the embodiment is not limited to the gyro sensor and may be, for example, an acceleration sensor, a pressure sensor, or a weight sensor.

The electronic component of the electronic device according to the embodiment is not limited to the sensor element. Various active components and various passive components can be used. The number of electronic components housed in the electronic device package is arbitrary.

In the embodiments, the configuration in which the electronic component is fixed to the package and supported on the package via the supporting member is explained as the example. However, the supporting member may be omitted and the electronic component may be directly fixed to and supported on the package.

In the embodiment, the configuration in which the electronic component and the package are electrically connected via the flexible wiring board is explained as the example. However, electrical connection of the electronic component and the package is not limited to this. For example, the electrical connection may be connection via a bonding wire or connection by face-down mounting.

The entire disclosure of Japanese Patent Application No. 2011-148687 filed Jul. 4, 2011 is expressly incorporated by reference herein.

What is claimed is:
1. An electronic device package comprising:
   a base member; and
   a lid member having, in plan view, a pair of first sides, which extend along a first direction, and a pair of second sides, which extend along a second direction crossing the first direction, and arranged on the base member while forming, between the lid member and the base member, an internal space in which an electronic component is housed, wherein
   a joined section of the base member and the lid member includes a first welded section formed by joining the base member and the lid member along the first sides using seam welding and a second welded section formed by joining the base member and the lid member along the second sides using the seam welding, and
   in plan view, the first welded section and the second welded section do not overlap each other, and an area where an area formed by extending the first welded section in the first direction and an area formed by extending the sec- ond welded section in the second direction overlap each other is located on an outer side with respect to a contour of the lid member.

2. The electronic device package according to claim 1, wherein the joined section of the base member and the lid member includes a third welded section formed by locally joining the base member and the lid member using energy beam welding to correspond to respective corners of a contour of the lid member in plan view.

3. The electronic device package according to claim 1, wherein
R-chamfering is applied to the respective corners of the contour of the lid member in plan view, and
when width of each of the first welded section and the second welded section is represented as W and a curvature radius of the R-chamfering is represented as R, a relation $W<(1-1/\sqrt{2})R$ is satisfied.

4. The electronic device package according to claim 3, wherein
the lid member includes a concave section for housing the electronic component, and a flange is formed in an outer periphery of an opening of the concave section, and
when width of the flange is represented as m, a relation $m<(1-1/\sqrt{2})R$ is satisfied.

5. The electronic device package according to claim 1, wherein
C-chamfering is applied to the respective corners of the contour of the lid member in plan view, and
when width of each of the first welded section and the second welded section is represented as W and a chamfering dimension of the C-chamfering is represented as C, a relation $W<C/2$ is satisfied.

6. The electronic device package according to claim 5, wherein
the lid member includes a concave section for housing the electronic component, and a flange is formed in an outer periphery of an opening of the concave section, and
when the width of the flange is represented as m, a relation $m<C/2$ is satisfied.

7. The electronic device package according to claim 1, wherein
the lid member is joined to the base member via a joining member formed of a metal material, and
the contour of the lid member is formed to overlap the joining member in plan view.

8. An electronic device comprising:
the electronic device package according to claim 1; and
an electronic component housed in the electronic device package.

9. An electronic device comprising:
the electronic device package according to claim 2; and
an electronic component housed in the electronic device package.

10. An electronic device comprising:
the electronic device package according to claim 3; and
an electronic component housed in the electronic device package.

11. An electronic device comprising:
the electronic device package according to claim 4; and
an electronic component housed in the electronic device package.

12. An electronic device comprising:
the electronic device package according to claim 5; and
an electronic component housed in the electronic device package.

13. An electronic device comprising:
the electronic device package according to claim 6; and
an electronic component housed in the electronic device package.

14. An electronic device comprising:
the electronic device package according to claim 7; and
an electronic component housed in the electronic device package.

15. An electronic apparatus comprising the electronic device according to claim 8.

16. An electronic apparatus comprising the electronic device according to claim 9.

17. An electronic apparatus comprising the electronic device according to claim 10.

18. An electronic apparatus comprising the electronic device according to claim 11.

19. An electronic apparatus comprising the electronic device according to claim 12.

20. An electronic apparatus comprising the electronic device according to claim 13.

* * * * *